US012021108B2

(12) United States Patent
Iwata

(10) Patent No.: US 12,021,108 B2
(45) Date of Patent: Jun. 25, 2024

(54) PHOTOELECTRIC CONVERSION APPARATUS, PHOTOELECTRIC CONVERSION SYSTEM, AND MOVING OBJECT

(71) Applicant: CANON KABUSHIKI KAISHA, Tokyo (JP)

(72) Inventor: Junji Iwata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/302,384

(22) Filed: Apr. 18, 2023

(65) Prior Publication Data

US 2023/0261027 A1  Aug. 17, 2023

Related U.S. Application Data

(63) Continuation of application No. 16/983,869, filed on Aug. 3, 2020, now Pat. No. 11,658,197.

(30) Foreign Application Priority Data

Aug. 8, 2019 (JP) ................................ 2019-146308

(51) Int. Cl.
*H01L 27/146* (2006.01)
*H01L 25/04* (2023.01)
*H01L 31/107* (2006.01)

(52) U.S. Cl.
CPC .... *H01L 27/14643* (2013.01); *H01L 31/1075* (2013.01); *H01L 25/043* (2013.01)

(58) Field of Classification Search
None
See application file for complete search history.

(56) References Cited

U.S. PATENT DOCUMENTS

| | | | |
|---|---|---|---|
| 9,331,116 B2 * | 5/2016 | Webster | H01L 27/1464 |
| 9,972,650 B2 * | 5/2018 | Kobayashi | H01L 27/1464 |
| 10,090,350 B2 * | 10/2018 | Kobayashi | H01L 27/1469 |
| 10,798,327 B2 * | 10/2020 | Kuroda | H01L 27/14634 |
| 11,309,440 B2 | 4/2022 | Ota | |
| 11,329,088 B2 * | 5/2022 | Ishino | H01L 27/1463 |

(Continued)

FOREIGN PATENT DOCUMENTS

| | | | | |
|---|---|---|---|---|
| DE | 102012214690 A1 * | 2/2014 | | H01L 27/1465 |
| EP | 2317558 A2 * | 5/2011 | | H01L 21/76898 |

(Continued)

OTHER PUBLICATIONS

T. Al Abbas, et al.; "Backside illuminated SPAD image sensor with 7.83μm pitch in 3D-stacked CMOS technology;" 2016 IEEE International Electron Devices Meeting (IEDM), pp. 8.1.1-8.1.4, Dec. 2016.

(Continued)

*Primary Examiner* — Scott B Geyer
(74) *Attorney, Agent, or Firm* — CANON U.S.A., INC. IP Division

(57) ABSTRACT

A photoelectric conversion apparatus includes a first and a second multilayer wiring layer. The first or the second multilayer wiring layer is provided with a first electrode supplied with a first voltage from an outside of the photoelectric conversion apparatus. The first electrode is not connected with a second semiconductor layer.

13 Claims, 16 Drawing Sheets

(56) References Cited

U.S. PATENT DOCUMENTS

| | | | |
|---|---|---|---|
| 2011/0050969 A1* | 3/2011 | Nishihara | H04N 25/60 348/308 |
| 2013/0248689 A1 | 9/2013 | Eldesouki | |
| 2013/0341694 A1* | 12/2013 | Maekawa | H01L 31/0322 257/435 |
| 2014/0091414 A1* | 4/2014 | Shimotsusa | H01L 25/0657 257/431 |
| 2015/0115131 A1* | 4/2015 | Webster | H04N 25/772 250/208.1 |
| 2016/0020235 A1 | 1/2016 | Yamashita | |
| 2016/0079464 A1* | 3/2016 | Sasaki | H01L 31/02005 257/432 |
| 2017/0186798 A1* | 6/2017 | Yang | H01L 27/14632 |
| 2017/0186800 A1* | 6/2017 | Ikeda | H01L 27/14689 |
| 2017/0221947 A1 | 8/2017 | Shishido | |
| 2018/0166494 A1* | 6/2018 | Shimotsusa | H01L 24/05 |
| 2018/0270405 A1 | 9/2018 | Ota | |
| 2019/0025364 A1* | 1/2019 | Kleppe | G01R 31/66 |
| 2019/0025365 A1 | 1/2019 | Granade et al. | |
| 2019/0068908 A1 | 2/2019 | Kobayashi | |
| 2019/0103504 A1* | 4/2019 | Yamashita | H01L 27/14636 |
| 2019/0189827 A1* | 6/2019 | Haraguchi | H04N 25/709 |
| 2019/0252442 A1* | 8/2019 | Tanaka | H01L 27/14623 |
| 2019/0253654 A1* | 8/2019 | Kuroda | H04N 25/772 |
| 2019/0333954 A1 | 10/2019 | Wakiyama | |
| 2020/0021767 A1 | 1/2020 | Ikeda | |
| 2020/0033482 A1 | 1/2020 | Negishi | |
| 2020/0045251 A1 | 2/2020 | Koizumi | |
| 2020/0105812 A1* | 4/2020 | Sze | H01L 27/14643 |
| 2020/0105813 A1* | 4/2020 | Hashiguchi | H01L 27/00 |
| 2020/0105814 A1* | 4/2020 | Hashiguchi | H01L 27/14636 |
| 2020/0227582 A1* | 7/2020 | Yamashita | H01L 27/14647 |
| 2020/0273901 A1* | 8/2020 | Nakamura | H01L 24/45 |
| 2020/0304736 A1 | 9/2020 | Shinohara | |
| 2020/0314375 A1 | 10/2020 | Nishina | |
| 2020/0343280 A1* | 10/2020 | Ishino | H01L 27/1469 |
| 2020/0343389 A1* | 10/2020 | Gäbler | H01L 27/1446 |
| 2020/0350345 A1* | 11/2020 | Hiramatsu | H01L 27/14603 |
| 2021/0084249 A1* | 3/2021 | Nakazawa | H01L 25/167 |
| 2021/0104570 A1 | 4/2021 | Mitsuhashi et al. | |
| 2021/0104571 A1* | 4/2021 | Shohji | H01L 25/167 |

FOREIGN PATENT DOCUMENTS

| | | | |
|---|---|---|---|
| JP | 2018-81945 A1 | 5/2018 | |
| JP | 2018512573 A | 5/2018 | |
| JP | 2018-157387 A | 10/2018 | |
| JP | 2019107823 A | 7/2019 | |
| JP | 2019140137 A | 8/2019 | |
| WO | WO-2012001935 A1 * | 1/2012 | H01L 27/14618 |
| WO | WO-2012004965 A1 * | 1/2012 | H01L 24/05 |
| WO | 2018/186195 A1 | 10/2018 | |

OTHER PUBLICATIONS

Myung-Jae Lee, et al.; "High-Performance Back-Illuminated Three-Dimensional Stacked Single-Photon Avalanche Diode Implemented in 45-nm CMOS Technology," IEEE Journal of Selected Topics in Quantum Electronics, vol. 24, No. 6, pp. 1-9, Nov.-Dec. 2018.

* cited by examiner

FIG.14B
FRONT VIEW
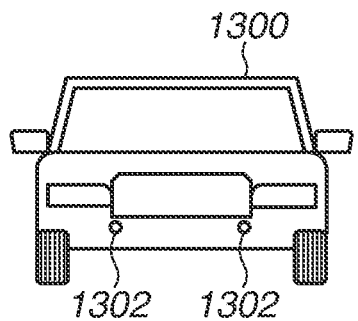
TOP VIEW
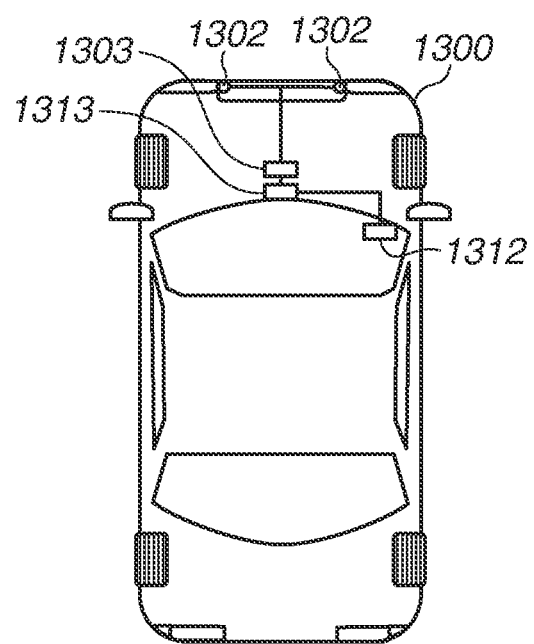
REAR VIEW
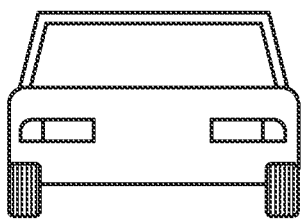

PHOTOELECTRIC CONVERSION APPARATUS, PHOTOELECTRIC CONVERSION SYSTEM, AND MOVING OBJECT

CROSS-REFERENCE TO RELATED APPLICATION

This application is a Continuation of U.S. application Ser. No. 16/983,869, filed Aug. 3, 2020, which claims priority from Japanese Patent Application No. 2019-146308, filed Aug. 8, 2019, which is hereby incorporated by reference herein in its entirety.

BACKGROUND

Field

The present disclosure relates to structures of a photoelectric conversion apparatus and a photoelectric conversion system.

Description of the Related Art

Certain photoelectric conversion apparatuses are known to be capable of detecting weak light at a single photon level by using avalanche (electron avalanche) multiplication. The specification of U.S. Patent Application Publication No. 2017/0186798 discusses a photoelectric conversion apparatus in which a sensor chip having both an array of a plurality of pixels and a circuit chip having a signal processing circuit formed therein are electrically connected in a layer structure. In the specification, an avalanche diode in which charges cause the avalanche multiplication is used as a pixel in the sensor chip of the photoelectric conversion apparatus.

The specification of U.S. Patent Application Publication No. 2017/0186798 does not consider wiring when a high voltage for driving avalanche diodes in a layer structure is supplied, not ensuring the sufficient reliability of the photoelectric conversion apparatus.

SUMMARY

According to an aspect of the present disclosure, a photoelectric conversion apparatus includes a first chip including a first semiconductor layer having an avalanche diode, and a first multilayer wiring layer, and a second chip including a second semiconductor layer having a signal processing portion for processing a signal from the avalanche diode, and a second multilayer wiring layer. The first and the second chips are stacked in layers on top of each other. The avalanche diode is applied with a first and a second voltage. The signal processing portion is supplied with a third voltage. A potential difference between the first and the third voltages is larger than a potential difference between the second and the third voltages. The first or the second multilayer wiring layer is provided with a first electrode supplied with the first voltage from an outside of the photoelectric conversion apparatus. The first electrode is not connected with the second semiconductor layer.

Further features of the present disclosure will become apparent from the following description of exemplary embodiments with reference to the attached drawings.

BRIEF DESCRIPTION OF THE DRAWINGS

FIG. 14B illustrates schematic diagrams of a moving object according to the eighth exemplary embodiment.

DESCRIPTION OF THE EMBODIMENTS

Figure 1A:
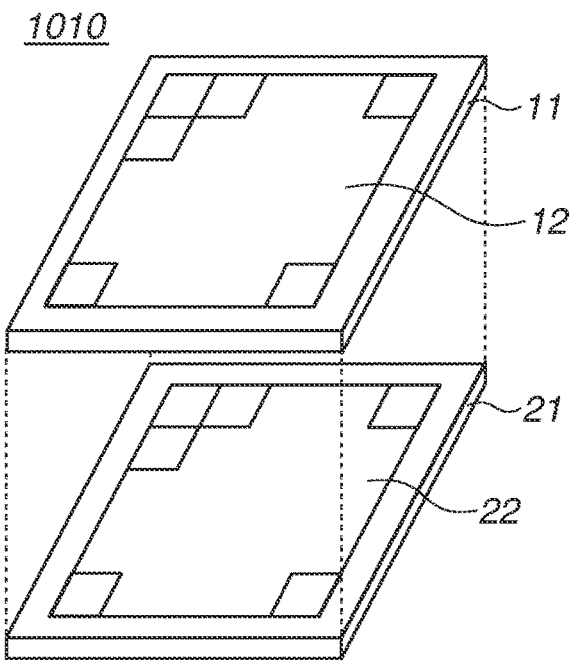
FIGS. 1A, 1B, and 1C are schematic views illustrating a photoelectric conversion apparatus, a sensor chip, and a circuit chip, respectively, according to a first exemplary embodiment.

Photoelectric conversion apparatuses according to exemplary embodiments of the present disclosure will be described below. In these exemplary embodiments, members assigned common reference numerals indicate the same members and members having the same function and effect, and redundant descriptions thereof will be omitted. Configurations according to each exemplary embodiment can be mutually exchanged with configurations according to other exemplary embodiments.

FIG. 1A illustrates a configuration of a stacked type photoelectric conversion apparatus according to a first exemplary embodiment. A photoelectric conversion apparatus 1010 includes two different chips (e.g., a sensor chip 11 and a circuit chip 21) that are stacked in layers on top of each other and are electrically connected.

The sensor chip 11 includes a pixel region 12. The circuit chip 21 includes a circuit region 22 for processing a signal detected by the pixel region 12.

Figure 1B:
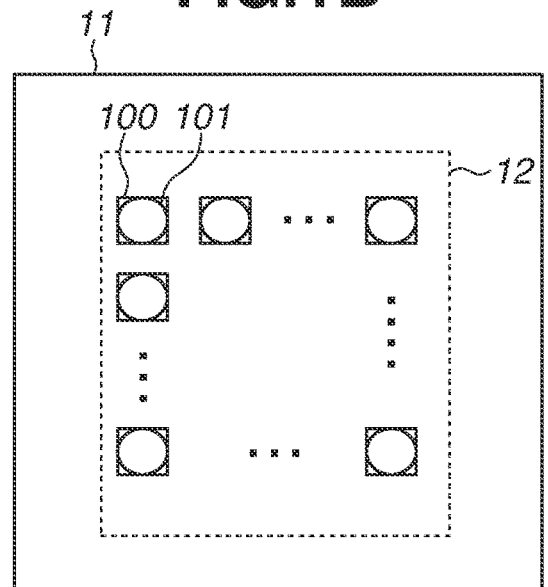

FIG. 1B illustrates an arrangement of the sensor chip 11. Pixels 100 having a photoelectric conversion portion 101 for converting light into an electrical signal are two-dimensionally arranged to form the pixel region 12. Although the pixels 100 are typically pixels for forming an image, the pixels 100 do not need to form an image in a case where the pixels are used for Time of Flight (TOF). In other words, the pixels 100 may be configured to measure the time when light arrives and quantity of the light.

Figure 1C:
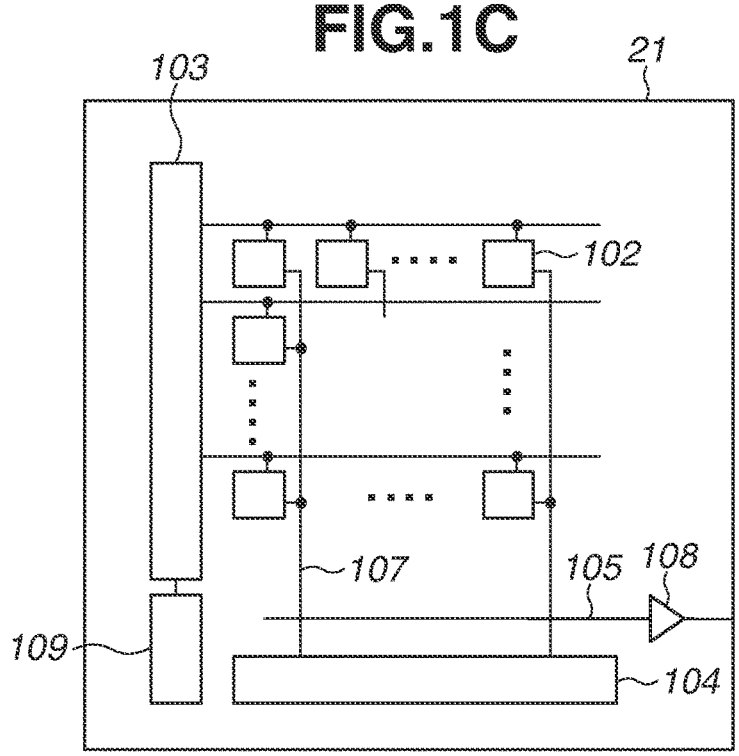

FIG. 1C illustrates a configuration of the circuit chip 21. The circuit chip 21 includes signal processing portions 102 for processing charges generated through the photoelectric conversion by the photoelectric conversion portions 101 illustrated in FIG. 1B, a control pulse generation unit 109, a horizontal scanning circuit unit 104, signal lines 107, and a vertical scanning circuit unit 103.

The photoelectric conversion portion 101 illustrated in FIG. 1B and the signal processing portion 102 illustrated in FIG. 1C are electrically connected with each other through a connection wiring provided for each pixel 100.

The vertical scanning circuit unit 103 receives a control pulse supplied from the control pulse generation unit 109 and supplies the control pulse to each pixel 100. For the vertical scanning circuit unit 103, a logic circuit, such as a shift register and an address decoder, is used.

A signal output from the photoelectric conversion portion 101 of each pixel 100 is processed by the signal processing portion 102. The signal processing portion 102 includes a counter and a memory for storing a digital signal.

The horizontal scanning circuit unit 104 outputs a control pulse for sequentially selecting each column to the signal processing portion 102 to read a signal from the memory of each pixel storing a digital signal.

For the selected column, the signal processing portion 102 of a pixel 100 selected by the vertical scanning circuit unit 103 outputs a signal to the signal lines 107 and 105.

The signal output to the signal line 105 is supplied to a recording unit or signal processing portion outside the photoelectric conversion apparatus 1010 via an output circuit 108.

Referring to FIG. 1B, the array of the pixels 100 in the pixel region 12 may be one-dimensionally arranged. The vertical scanning circuit unit 103 and the horizontal scanning circuit unit 104 may be disposed for each of a plurality of divided regions in the circuit region 22. Not all of the pixels 100 need to be provided with the function of the signal processing portion 102. For example, a plurality of the pixels 100 may share one signal processing portion 102, and signal processing may be sequentially performed.

Figure 2:
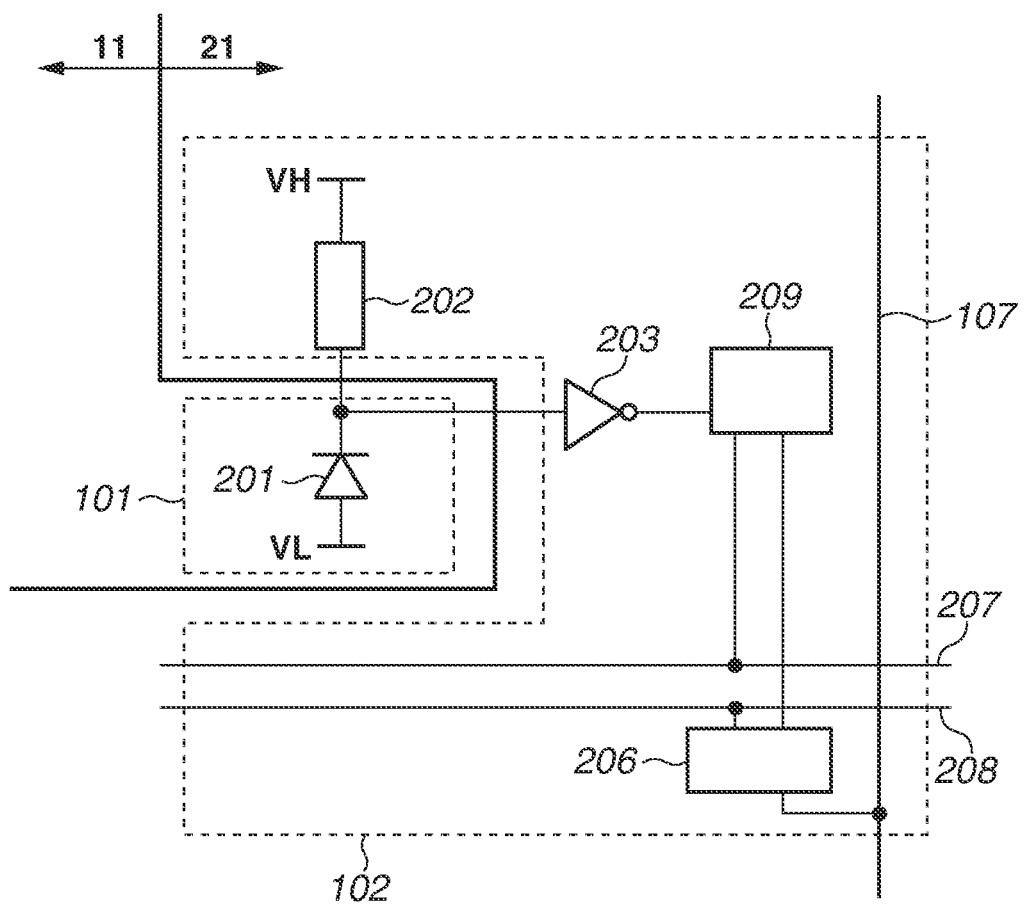
FIG. 2 is a block diagram illustrating a pixel according to the first exemplary embodiment.

FIG. 2 illustrates an example of a block diagram including FIG. 1B and the equivalent circuit illustrated in FIG. 1C. Referring to FIG. 2, the photoelectric conversion portion 101 having a photodiode 201 is disposed in the sensor chip 11, and other members are disposed in the circuit chip 21.

The photodiode 201 generates a charge couple corresponding to incident light through photoelectric conversion. The anode of the photodiode 201 is supplied with a voltage VL (first voltage). The cathode of the photodiode 201 is supplied with a voltage VH (second voltage) that is higher than the voltage VL supplied to the anode thereof. The voltage VH (second voltage) is also supplied to a circuit (not illustrated) included in the circuit chip 21. Further, a reverse bias voltage is applied across the anode and the cathode of the photodiode 201 so that the photodiode 201 functions as an avalanche diode. Supplying voltages in this way causes avalanche multiplication of charges generated by incident light, and an avalanche current occurs. In a case where a reverse bias voltage is supplied, a potential difference between the anode and the cathode larger than a breakdown voltage causes a Geiger mode operation of the avalanche diode. An example of the potential difference includes a voltage VL (first voltage) of −30 V and a voltage VH (second voltage) of 1.1 V.

A quench element 202 is connected to a power source for supplying the voltage VH and the photodiode 201. The quench element 202 has a function of converting a change of the avalanche current generated in the photodiode 201 to a voltage signal. When the signal is amplified by the avalanche multiplication, the quench element 202 functions as a load circuit (quench circuit), restricts a voltage supplied to the photodiode 201, and prevents the avalanche multiplication (quench operation). The photodiode 201 disposed in the sensor chip 11 and the quench element 202 disposed in the circuit chip 21 are electrically connected with each other via a connection wiring disposed for each pixel 100.

The signal processing portion 102 includes a waveform shaping unit 203, a counter circuit 209, and a selection circuit 206. According to the present specification, the signal processing portion 102 includes either one of the waveform shaping unit 203, the counter circuit 209, and the selection circuit 206. For example, the counter circuit 209 also serves as the signal processing portion 102.

The waveform shaping unit 203 shapes a potential change at the cathode of the photodiode 201 and outputs a pulse signal. The potential change is obtained at the time of photon detection. For example, an inverter circuit is used as the waveform shaping unit 203. Referring to FIG. 2, although a single inverter is used as the waveform shaping unit 203, a plurality of inverters connected in series and other circuits having waveform shaping effects are also applicable.

The counter circuit 209 counts the pulse signal output from the waveform shaping unit 203. In a case where the counter circuit 209 is, for example, an N-bit counter (N is a positive integer), the counter circuit 209 can count up to approximately the N-th power of 2 pulse signals generated by a single photon. The counted signal is stored as a detected signal. When a control pulse pRES is supplied via a drive wire 207, the signal stored in the counter circuit 209 is reset.

The selection circuit 206 is supplied with a control pulse pSEL from the vertical scanning circuit unit 103 illustrated in FIG. 1C via a drive wire 208 illustrated in FIG. 2 (not illustrated in FIG. 1C) to electrically connect or disconnect between the counter circuit 209 and the signal line 107. The selection circuit 206 includes, for example, a buffer circuit for outputting a signal.

Between the quench element 202 and the photodiode 201 or between the photoelectric conversion portion 101 and the signal processing portion 102, a switch (e.g., transistor) may be disposed to change electrical connection. Likewise, the voltage VH or VL supplied to the photoelectric conversion portion 101 may be electrically changed by using a switch (e.g., transistor).

In the pixel region 12 where a plurality of pixels is arranged in a matrix form, a captured image may be acquired through a rolling shutter operation or a global electronic shutter operation. In the rolling shutter operation, the count of the counter circuit 209 is sequentially reset on a row basis, and the signal stored in the counter circuit 209 is sequentially output on a row basis. In the global electronic shutter operation, the count of the counter circuit 209 of all pixel rows is reset at the same time, and the signal stored in the counter circuit 209 is sequentially output on a row basis. In a case where the global electronic shutter operation is used, it is desirable to provide a means for changing between a case where counting is operated by the counter circuit 209 and a case where counting is not operated. The changing means is, for example, a switch described above.

The present exemplary embodiment has been described above centering on a configuration using the counter circuit 209. However, instead of using the counter circuit 209, the photoelectric conversion apparatus 1010 may acquire the pulse detection timing by using a Time to Digital Converter (TDC) and a memory. In this case, the generation timing of the pulse signal output from the waveform shaping unit 203 is converted into a digital signal by the TDC. For the measurement of the timing of the pulse signal, the TDC is supplied with a control pulse pREF (reference signal) from the vertical scanning circuit unit 103 illustrated in FIG. 1C via a drive wire. The TDC acquires, in a digital manner, a signal as an input timing of the signal output from each pixel via the waveform shaping unit 203, the timing being a relative time with reference to the control pulse pREF.

Figure 3:
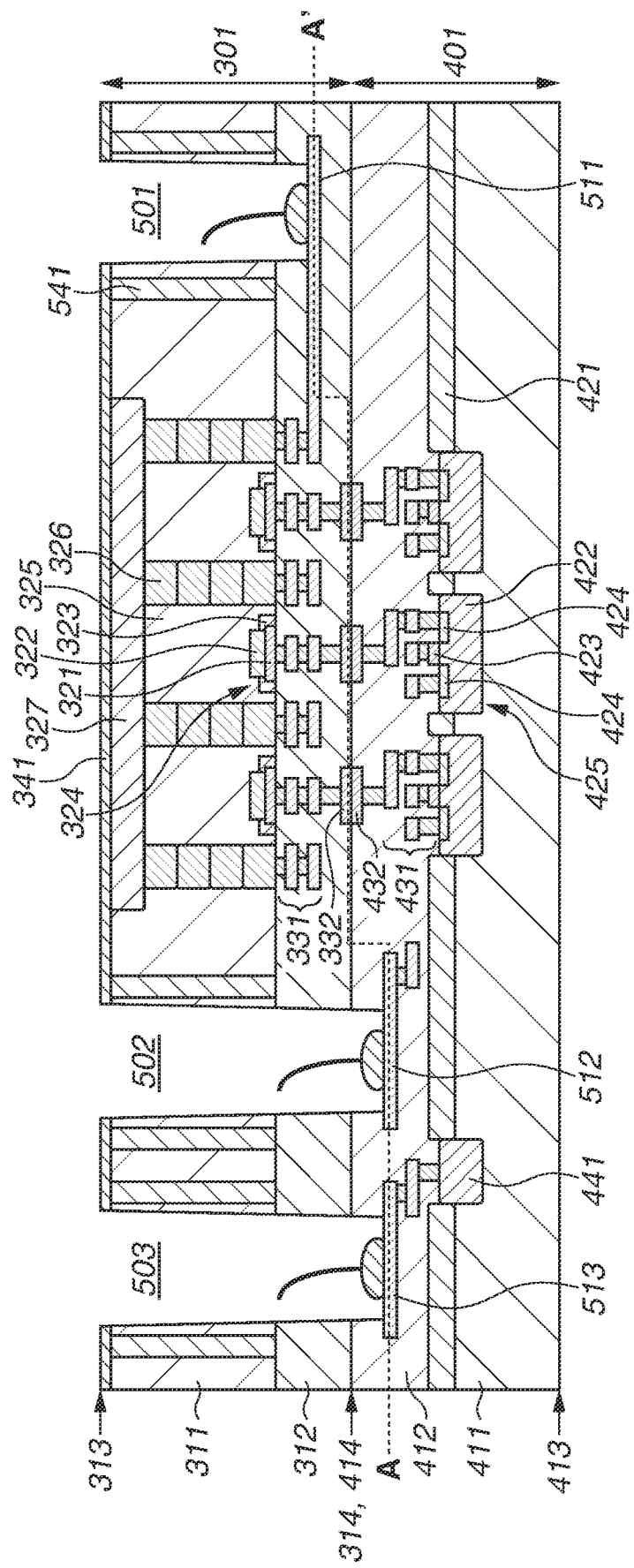
FIG. 3 is a cross-sectional view illustrating the photoelectric conversion apparatus according to the first exemplary embodiment.

(Cross-Sectional View of Photoelectric Conversion Apparatus according to Present Exemplary Embodiment: FIG. 3)

FIG. 3 is a cross-sectional view illustrating the photoelectric conversion apparatus according to the present exemplary embodiment. According to the present exemplary embodiment, a first chip 301 and a second chip 401 are stacked in layers on top of each other and electrically connected with each other.

(Configuration of First Chip 301)

The first chip 301 is provided with a pixel region 521. The second chip 401 is provided with a circuit region 531 for processing a signal detected in the pixel region 521. The first chip 301 and the second chip 401 correspond to the sensor chip 11 and the circuit chip 21 illustrated in FIG. 1A, respectively.

The first chip 301 includes a semiconductor layer 311 (first semiconductor layer) and a wiring layer 312 (first wiring layer). In the description, the light incidence surface of the first chip 301 is a surface 313 (first surface), and the surface on the side opposite to the surface 313 is a surface 314 (second surface).

The semiconductor layer 311 in the first chip 301 is provided with a first semiconductor region 321 of the first conductivity type and a second semiconductor region 322 of the second conductivity type. The first semiconductor region 321 and the second semiconductor region 322 form a PN junction to serve as an avalanche diode 324.

The semiconductor region where charges used as signal charges are majority charges out of charge couples occurring in the photoelectric conversion portion 101 is referred to as a semiconductor region of the first conductivity type. The semiconductor region where charges not used as signal charges are majority carriers is referred to as a semiconductor region of the second conductivity type. For example, in a case of using electrons as signal charges, the semiconductor region of the first conductivity type is formed of an n-type semiconductor, and the semiconductor region of the second conductivity type is formed of a p-type semiconductor. In a case of using holes as signal charges, the semiconductor region of the first conductivity type is formed of a p-type semiconductor, and the semiconductor region of the second conductivity type is formed of an n-type semiconductor. In the present exemplary embodiment, electrons are used as signal charges.

At both ends of the first semiconductor region 321, a third semiconductor region 323 of the first or the second conductivity type for alleviating the electric field concentration is disposed. In this case, the impurity concentration of the third semiconductor region 323 is made lower than the impurity concentration of the first semiconductor region 321. For example, in a case where the impurity concentrations of the first semiconductor region 321 is $6.0*10^{18}$ [atms/cm$^3$] or more, the impurity concentration of the third semiconductor region 323 is $1.0*10^{16}$ [atms/cm$^3$] or more and $1.0*10^{18}$ [atms/cm$^3$] or less.

A region deeper than the second semiconductor region 322, the region being on the side of the surface 313, is provided with a fourth semiconductor region 325 of the second conductivity type. A region between the adjacent pixels is provided with a fifth semiconductor region 326 of the second conductivity type as a pixel isolation region. A region deeper than the fourth semiconductor region 325, the region being on the side of the surface 313, is provided with a sixth semiconductor region 327 of the second conductivity type.

In this case, the impurity concentrations of the fifth semiconductor region 326 and the sixth semiconductor region 327 are made higher than the impurity concentration of the fourth semiconductor region 325. Thus, the charges generated in the fourth semiconductor region 325 through the photoelectric conversion are collected by the avalanche diode 324 without leakage to adjacent pixels, and thereby enabling the avalanche multiplication to take place.

A boundary surface on the side of the surface 313 in the first chip 301 is provided with a pinning membrane 341 for restricting a dark current occurring in the chip boundary surface.

The wiring layer 312 in the first chip 301 is provided with a multilayer wiring layer 331 (first multilayer wiring layer). The multilayer wiring layer 331 includes a wiring layer for applying an anode potential to the avalanche diode 324, and a wiring layer for applying a cathode potential to the avalanche diode 324. A signal detected in the avalanche diode 324 is transferred to the second chip 401 via the multilayer wiring layer 331 and a bonding portion 332 (first bonding portion).

The bottom of a pad opening 501 (first opening) is provided with a pad electrode 511 (first electrode). In the pad opening 501, the pad electrode 511 is exposed and electrically connected to an external power source. The bottom of the pad opening 501 is disposed between the surface 313 (first surface) and the surface 314 (second surface) of the first chip 301. The pad electrode 511 (first electrode) is applied, via a wire bonding, with a voltage necessary to cause the avalanche multiplication in the bonding portion between the first semiconductor region 321 of the first conductivity type and the second semiconductor region 322 of the second conductivity type. In a case where the top layer of the multilayer wiring layer 331 is a pad electrode 511, the top layer of the multilayer wiring layer 331 may be formed of an aluminum wiring and other wiring layers may be formed of copper wiring.

The semiconductor layer 311 is provided with a trench oxide film 541. For a semiconductor chip having various circuits and pixels, elements need to be protected from moisture and ions entering from the atmospheres around the semiconductor chip. Thus, the trench oxide film 541 is disposed on the semiconductor layer 311 around the pad opening 501 to protect elements from moisture and ions entering from the pad opening 501. The trench oxide film 541 is also disposed on the semiconductor layer 311 around pad openings 502 and 503 (described below). To improve resistance to humidity, a metal wiring may be provided instead of or in addition to the trench oxide film 541. This metal wiring enables protecting elements from moisture and ions entering the wiring layers.

(Configuration of Second Chip 401)

The second chip 401 includes a semiconductor layer 411 (second semiconductor layer) and a wiring layer 412 (second wiring layer). The second chip 401 will be described below on the premise that the surface on the side of the first chip 301 is a surface 414 (third surface) and the surface on the side opposite to the surface 414 is a surface 413 (fourth surface).

The semiconductor layer 411 in the second chip 401 is provided with a circuit for processing a signal transferred from the first chip 301. More specifically, a well region 422, a gate electrode 423, and a source and drain region 424 are disposed to form a metal oxide semiconductor (MOS) transistor 425. Examples of the MOS transistor 425 disposed in the second chip 401 include a quench element. The quench element, equivalent to the element 202 illustrated in FIG. 2, functions as a load circuit when charges generated through the photoelectric conversion cause the avalanche multiplication. The quench element performs a quench operation for preventing the avalanche multiplication by restricting the voltage supplied to the avalanche diode 324.

A region between adjacent MOS transistors 425 is provided with an element isolation region 421. Examples of the apparatus isolation region 421 include Local Oxidation of Silicon (LOCOS) and Shallow Trench Isolation (STI).

A bonding portion 432 (second bonding portion) disposed on the wiring layer 412 in the second chip 401 comes in contact with the bonding portion 332 (first bonding portion) in the first chip 301, and has a role of transferring the output of the avalanche diode 324 in the first chip 301 to the second chip 401. This bonding portion 432 is metal wiring such as copper wiring.

The wiring layer 412 in the second chip 401 is provided with a multilayer wiring layer 431 (second multilayer wiring layer). The multilayer wiring layer 431 include, for example, a wiring for transferring a signal (transferred from the first chip 301) to the processing circuits in the second chip 401, and a power source wiring and a ground wiring for driving the signal processing portion 102 included in the second chip 401.

The semiconductor layer 411 in the second chip 401 is provided with a ground region 441. The voltage of the ground potential (ground voltage, third voltage) is supplied to the ground region 441 via a pad electrode 513 (third electrode) disposed at the bottom of the pad opening 503 (third opening). The bottom of the pad opening 503 is disposed between the surface 414 (third surface) and the surface 413 (fourth surface) of the second chip 401. The third voltage is, for example, 0 V. Referring to FIG. 3, the voltage applied via the pad electrode 513 (third electrode) is supplied to the ground region 441. However, the ground region 441 may not be provided. In this case, the voltage applied via the pad electrode 513 (third electrode) is directly supplied to other circuits.

The drain electrodes of the MOS transistors 425 disposed in the second chip 401 are supplied with a predetermined potential via the pad electrode 512 (second electrode) disposed at the bottom of the pad opening 502 (second opening). The bottom of the pad opening 502 is disposed between the surface 414 (third surface) and the surface 413 (fourth surface) of the second chip 401. As described above, the MOS transistors 425 are, for example, quench elements that function as a load circuit when the signal is amplified through the avalanche multiplication. In this case, the voltage VH (second voltage) is, for example, 1.1 V. Since the voltage VL (first voltage) is, for example, −30 V, the potential difference between the voltage VL (first voltage) and the voltage VH (second voltage) is larger than the potential difference between the voltage VH (second voltage) and the voltage of the ground potential (third voltage).

The potential difference between the voltage VL (first voltage) and the voltage of the ground potential (third voltage) is larger than the potential difference between the voltage VH (second voltage) and the voltage of the ground potential (third voltage).

Figure 4A:
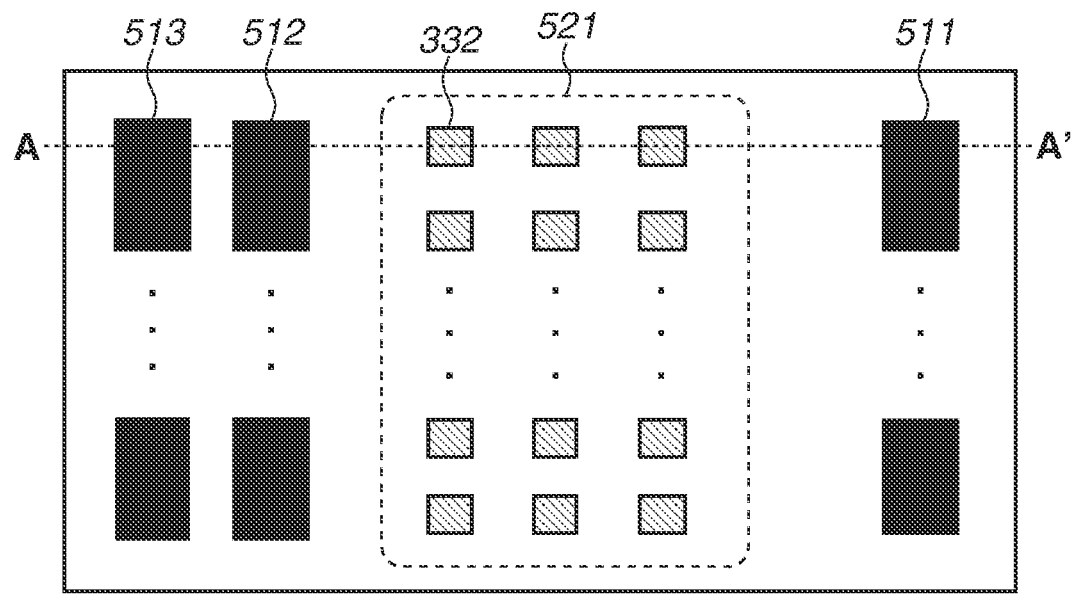
FIGS. 4A and 4B are plan views illustrating the photoelectric conversion apparatus according to the first exemplary embodiment.

FIG. 4A is a plan view illustrating the photoelectric conversion apparatus planarly viewed along the broken line A-A' illustrated in FIG. 3. The planar view refers to the arrangement of the photoelectric conversion apparatus 1010 viewed from a direction perpendicular to the principal surface of the semiconductor layer 311 or 411 (normal direction of the principal surface). When planarly viewed, overlapped members are assumed to be transparent.

Referring to FIG. 4A, the bonding portions 332 for transferring the signal generated by each pixel to the second chip 401 are two-dimensionally arranged in the pixel region 521. More specifically, a plurality of the bonding portions 332 is disposed in both a first direction 550 (row direction) and a second direction 560 (column direction) perpendicularly intersecting the first direction 550. The plurality of the pad electrodes 511, 512, and 513 is disposed outside the pixel region 521.

In the second direction 560 (column direction), the length of each of the pad electrodes 511, 512, and 513 is larger than the length of each bonding portion 332. More specifically, one pad electrode is provided for the bonding portions 332 disposed over a plurality of rows (two rows in a case of FIG. 4A). This is because the potential supplied from each pad electrode can be commonly supplied to a plurality of pixels. Further in a case where one pad electrode is disposed for each row, a pad electrode needs to be disposed for each pixel pitch, and thus this case is unsuitable for miniaturization.

Referring to FIG. 4A, also in the first direction 550 (row direction), the length of each of the pad electrodes 511, 512, and 513 is larger than the length of each bonding portion 332. Consequently, the area of each of the pad electrodes 511, 512, and 513 is larger than the area of each bonding portion 332.

Referring to FIG. 4A, in lieu of disposing one pad electrode for the bonding portions 332 for all rows, one pad electrode is disposed to the bonding portions 332 for a predetermined number of rows that is smaller than the total number of rows. According to the present exemplary embodiment, since an avalanche diode is included in the pixel portion, an avalanche current may flow in a pad electrode for applying a potential to the pixel. If one pad electrode is disposed in all rows, the limitation on the allowable amount of current which can be sent to one pad electrode may be exceeded. Thus, one pad electrode is disposed for the bonding portions of a predetermined number (not all) of rows.

In FIG. 4A, the length of the pad electrode is made larger than the length of the bonding portion in both the first direction 550 and the second direction 560. However, pitch may be increased by increasing the length in either direction of the first direction 550 and the second direction 560.

In FIG. 4A, one pad electrode is disposed for a plurality of rows. However, one pad electrode may be disposed for a plurality of columns.

Figure 4B:
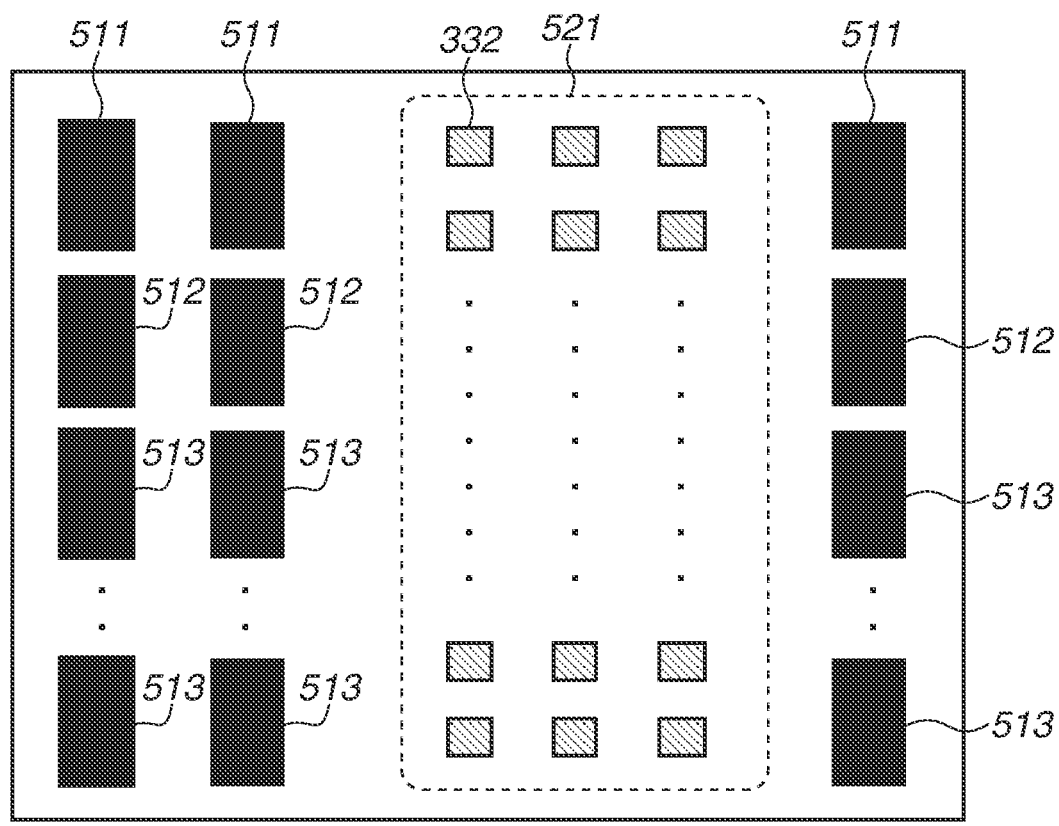

Further, in FIG. 4A, the pad electrodes 511 are collectively disposed on the right-hand side of the pixel region, and the pad electrodes 512 and 513 are collectively disposed on the left-hand side of the pixel region. On the other hand, as illustrated in FIG. 4B, a unit including the pad electrodes 511, 512, and 513 may be disposed on each of the right- and the left-hand sides of the pixel region. Charges (electrons and holes) of each pixel having undergone the avalanche multiplication are collected by these electrodes. For example, electrons are collected by the pad electrodes 512, and holes are collected by the pad electrodes 511. For example, referring to FIG. 4A, if electrons and holes are generated by the pixel at an upper left corner of the pixel region, electrons are immediately collected by the pad electrode 512 disposed to the left side, whereas holes are collected by the pad electrode 511 disposed to the right side after a predetermined time period. In this case especially for holes, avalanche charges are accumulated in each pixel until holes are collected by the pad electrode 511 disposed to the right side, possibly causing a voltage drop. On the other hand, referring to FIG. 4B, the pad electrodes 511 and 512 are disposed on both the right- and the left-hand sides. In this case, both electrons and holes having undergone the avalanche multiplication are collected in a short time, and thus the above-described voltage drop hardly occurs. The arrangement illustrated in FIG. 4B provides an advantage of preventing the generation of shading.

The first semiconductor region 321 of the first conductivity type of the avalanche diode 324 disposed in the first chip 301 is supplied with the voltage VH (second voltage) from the pad electrodes 512. This voltage supply is performed through the MOS transistors 425, the multilayer wiring layer 431 in the second chip 401, the bonding portion 432 in the second chip 401, the bonding portions 332 in the first chip 301, and the multilayer wiring layer 331 in the first chip 301. The second semiconductor region 322 of the second conductivity type is supplied with the voltage VL (first voltage) through the pad electrodes 511, the multilayer wiring layer 331, the fifth semiconductor region 326 of the second conductivity type, and the fourth semiconductor region 325 of the second conductivity type disposed in the first chip 301. The voltage difference between the voltage VL (first voltage) and the voltage VH (second voltage) is assumed to be applied with a sufficient electric field that causes the avalanche multiplication at the bonding portion between the first semiconductor region 321 of the first conductivity type and the second semiconductor region 322 of the second conductivity type. The required voltage difference is, for example, 6V or higher (31.1 V in the above-described example).

To increase the degree of integration of the processing circuits in the circuit region 531 in the second chip 401, it is desirable to dispose minute transistors with a low drive voltage. On the other hand, the voltage VL (first voltage) applied to the pad electrode 511 is required only for the first chip 301 on which an avalanche photodiode is disposed, and is not required to be supplied to the circuit region 531 in the second chip 401. According to the present exemplary embodiment, the pad electrode 511 is accordingly configured not to be electrically connected with the semiconductor layer 411 in the second chip 401. More specifically, wirings electrically connected to the pad electrode 511 are configured not to exceed the boundary of the bounding surface between the first chip 301 and the second chip 401. Thus, this enables preventing the reduction of the reliability of the circuit region 531 in the second chip 401.

The potential applied to the pad electrode 512 is supplied not only to the MOS transistors 425 but also to various processing circuits disposed in the second chip 401. With an increase in a number of functions demanded for the processing circuits and a number of elements mounted in the second chip 401, high-speed processing may become an issue. In this case, as illustrated in FIG. 3, it is more desirable to dispose the pad electrode 512 in the second chip 401 and supply a potential than to dispose the pad electrode 512 in the first chip 301 and supply a potential via the bonding portion. This configuration reduces signal propagation delays due to wiring, and thereby increasing the operation speeds of various processing circuits disposed in the second chip 401.

The pad electrode 511 disposed in the first chip 301 is disposed in the wiring layer having the same height as that of the top layer wiring of the multilayer wiring layer 331 in the first chip 301. The pad electrodes 512 and 513 disposed in the second chip 401 are disposed in the wiring layer having the same height as that of the top layer wiring of the multilayer wiring layer 431 in the second chip 401. The present specification assumes that the bonding portions 332 and 432 are not included in the multilayer wiring layers 331 and 431, respectively. This configuration enables reducing the difference in the level of the pad electrodes disposed in the first chip 301 and the second chip 401, facilitating the etching process for forming pad openings. This configuration also facilitates the process of forming wire bondings for pad openings.

Figure 5:
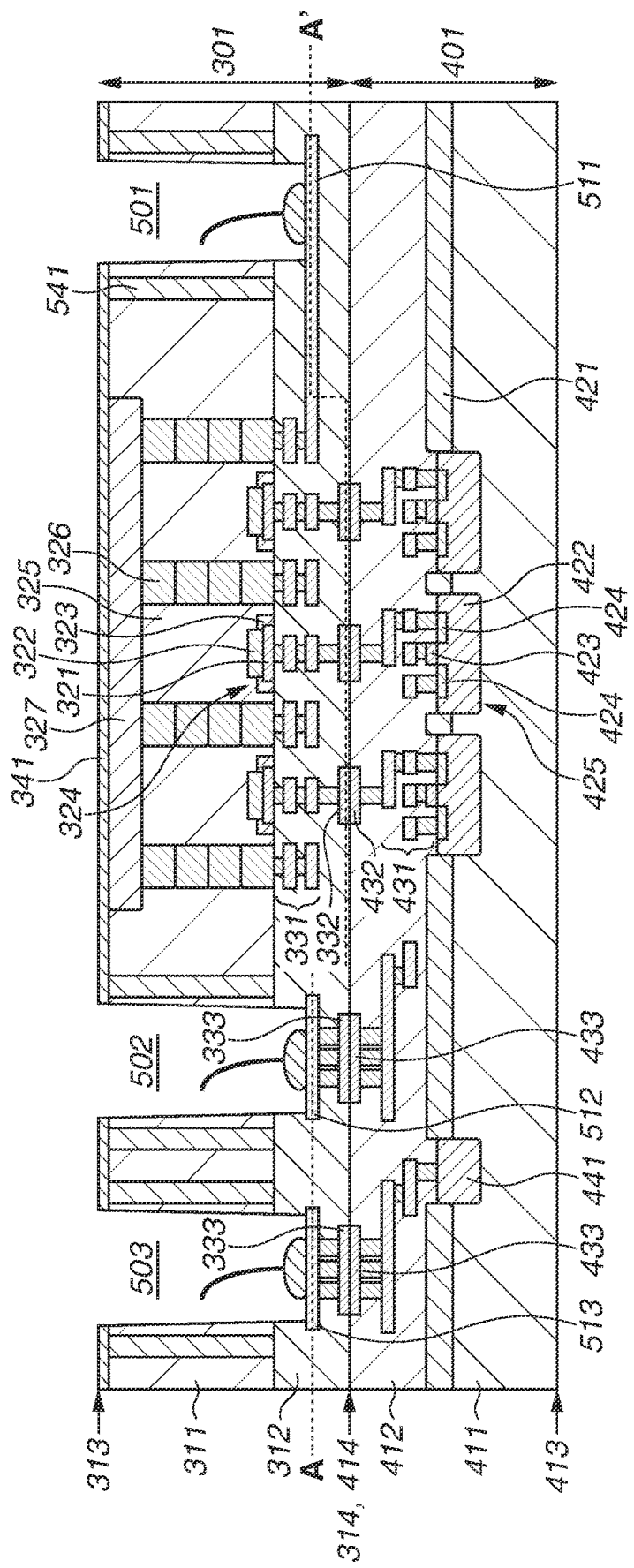
FIG. 5 is a cross-sectional view illustrating a photoelectric conversion apparatus according to a second exemplary embodiment.

FIG. 5 is a cross-sectional view illustrating a photoelectric conversion apparatus according to a second exemplary embodiment. The second exemplary embodiment differs from the first exemplary embodiment in that the pad electrodes 512 and 513 are disposed in the first chip 301 and that the second chip 401 is supplied with a potential via the bonding portions 333 and 433. For members common to the first exemplary embodiment, redundant descriptions thereof will be omitted.

As illustrated in FIG. 3, according to the first exemplary embodiment, the pad opening 501 differs in depth from the pad openings 502 and 503. Thus, it is desirable to apply the etching and wire bonding conditions most suitable for the depths of these pad openings. In contrast, according to the second exemplary embodiment illustrated in FIG. 5, the pad electrodes 511, 512, and 513 are formed in the first chip 301. More specifically, the bottoms of the pad openings 501, 502, and 503 are disposed between the surface 313 (first surface) and the surface 314 (second surface) of the first chip 301. This configuration enables equalizing the depths of the pad openings 501, 502, and 503 in comparison with the first exemplary embodiment. This thereby reduces optimization of the etching and wire bonding conditions when forming pad openings, for each pad opening.

It is desirable to dispose the pad electrodes 511, 512, and 513 in the same wiring layer of the multilayer wiring layer 331 in the first chip 301. More specifically, referring to FIG. 5, the pad electrodes 511, 512, and 513 are disposed in the top layer of the multilayer wiring layer 331. Since the pad openings have a same depth, it is possible to equalize the etching conditions for forming pad openings and the wire bonding conditions for forming wire bondings. Thus, the pad openings and wire bonding can be formed in a same process.

Referring to FIG. 5, each of the pad electrodes 512 and 513 is connected with the bonding portion 333 via a plurality of via plugs. In other words, one pad electrode and one bonding portion are connected via a plurality of via plugs. Likewise, the wiring disposed in the top layer of the multilayer wiring layer 431 disposed in the second chip 401 is connected with the bonding portion 433 via a plurality of via plugs. This enables reducing an electrical resistance and restricting signal propagation delays.

According to the first exemplary embodiment as described above, the pad electrode 511 in the first chip 301 is applied with the voltage VL (first voltage) out of the voltages for causing the avalanche multiplication of the avalanche diode 324. This voltage is drawn in the multilayer wiring layer 331 disposed in the first chip 301, and therefore is not supplied to the circuit region 531 in the second chip 401. This voltage can accordingly prevent the reduction of the reliability of the circuit region 531 disposed in the second chip 401.

Since a cross-sectional view including the broken line A-A' illustrated in FIG. 5 is equivalent to the cross-sectional view illustrated in FIG. 3, detailed descriptions thereof will be omitted.

The above-described second exemplary embodiment enables preventing the reliability reduction of the circuit region 531 in the second chip 401, and also enables facilitating the forming process of the pad openings and wire bondings.

Figure 6:
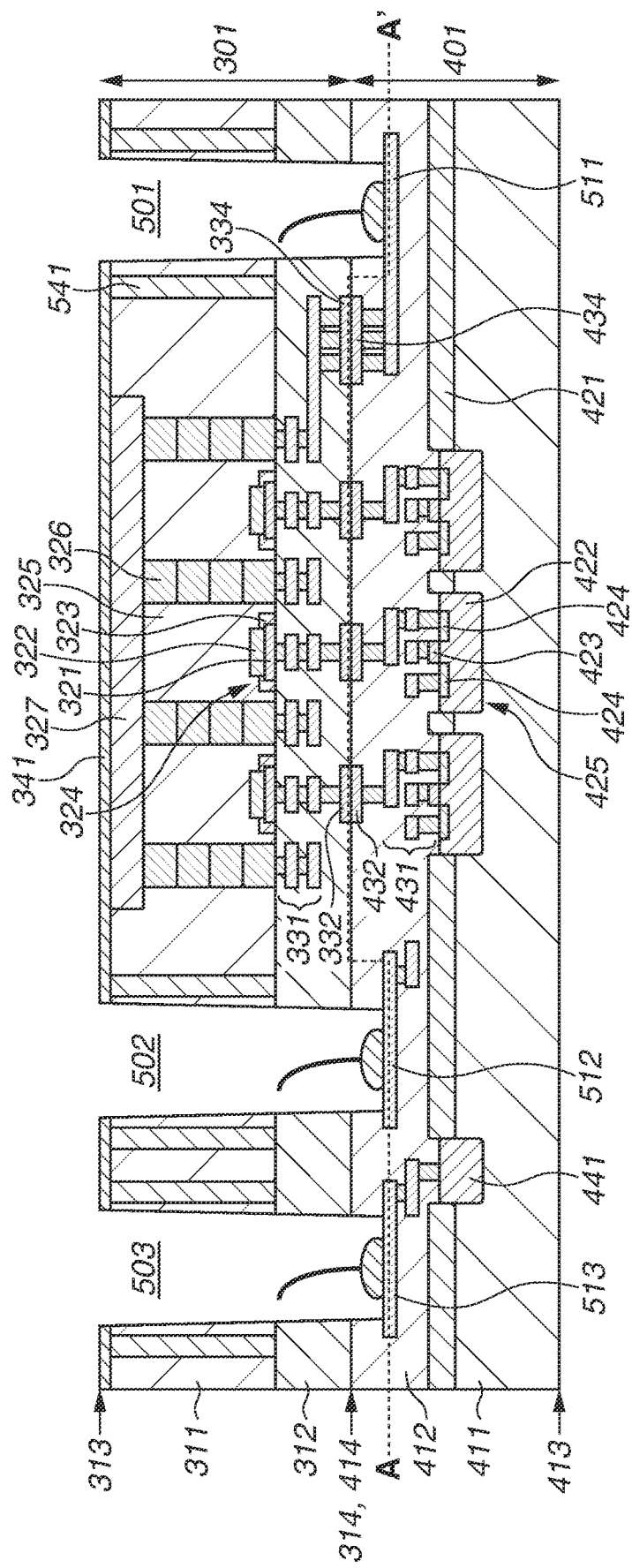
FIG. 6 is a cross-sectional view illustrating a photoelectric conversion apparatus according to a third exemplary embodiment.

FIG. 6 is a cross-sectional view illustrating a photoelectric conversion apparatus according to a third exemplary embodiment. The third exemplary embodiment differs from the first exemplary embodiment in that the pad electrode 511 is disposed in the second chip 401 and that a potential is supplied to the first chip 301 via the bonding portions 434 and 334. For members common to the first exemplary embodiment, redundant descriptions thereof will be omitted.

According to the first exemplary embodiment, since the pad opening 501 differs in depth from the pad openings 502 and 503, most suitable conditions for the etching and wire bonding are applied to each of the pad opening depth. According to the third exemplary embodiment illustrated in FIG. 6 in contrast, the pad electrodes 511, 512, and 513 are formed in the second chip 401. More specifically, the bottoms of the pad openings 501, 502 and 503 are disposed between the surface 414 (third surface) and the surface 413 (fourth surface) of the second chip 401. This configuration enables equalizing the depths of the pad openings 501, 502, and 503 in comparison with the first exemplary embodiment. Thus, there is no need to optimize the etching and wire bonding conditions in forming pad openings, for each pad opening.

According to the first exemplary embodiment as described above, the pad electrode 512 is disposed in the second chip 401. The potential of the pad electrode 512 is supplied not only to the MOS transistors 425 but also to various processing circuits mounted in the second chip 401. With an increase in a number of functions demanded for the processing circuits and the number of elements mounted in the second chip 401, high-speed processing may become an issue. In this case, as illustrated in FIG. 6, it is more desirable to dispose the pad electrode 512 in the second chip 401 and supply a potential than to dispose the pad electrode 512 in the first chip 301 and supply a potential via the bonding portion. This configuration reduces signal propagation delays due to wiring, increasing operation speeds of various processing circuits disposed in the second chip 401.

According to the third exemplary embodiment, the pad electrode 511 is configured not to be electrically connected with the semiconductor layer 411 in the second chip 401. This enables avoiding degradation of reliability of the circuit region 531 in the second chip 401.

Figure 7:
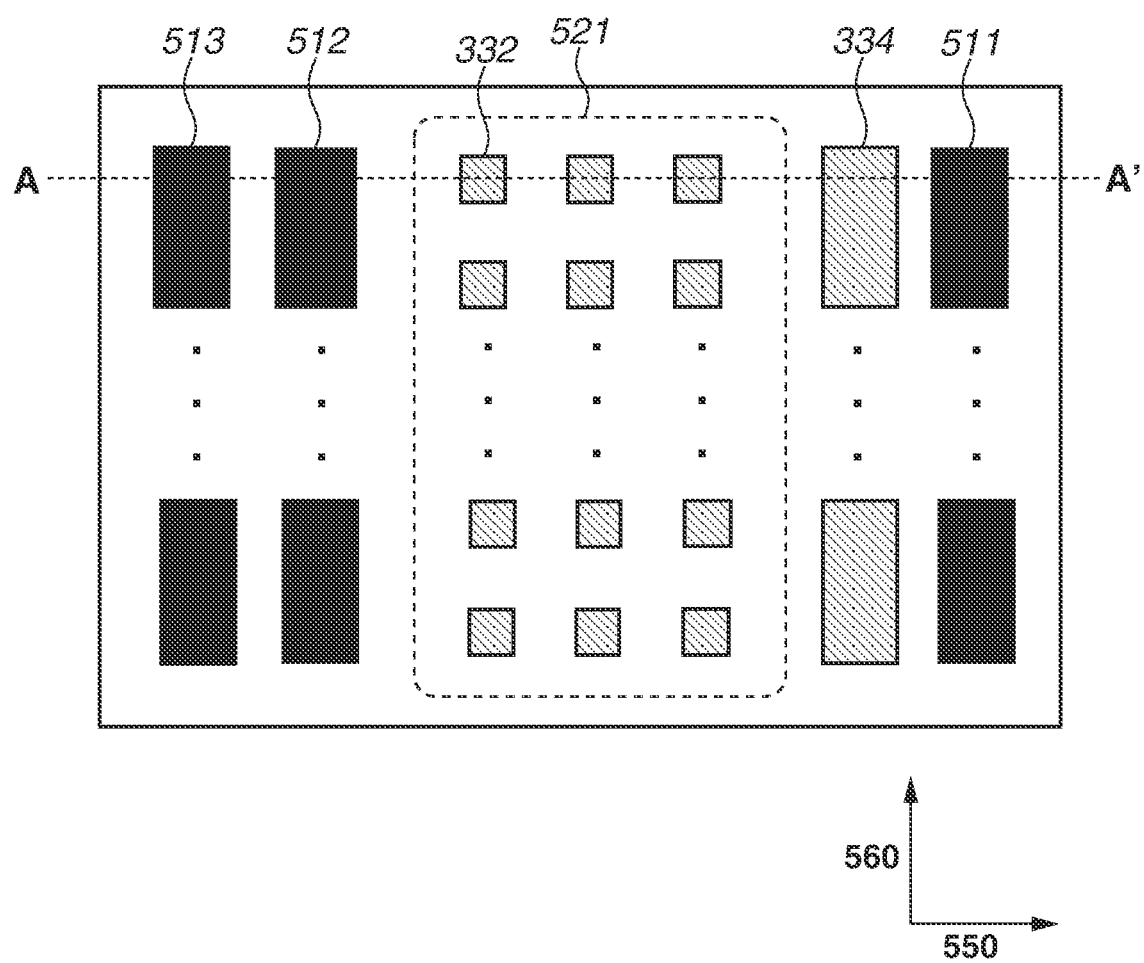
FIG. 7 is a plan view illustrating the photoelectric conversion apparatus according to the third exemplary embodiment.

FIG. 7 is a plan view illustrating the photoelectric conversion apparatus planarly viewed along the broken line A-A' illustrated in FIG. 6. In the pixel region 521, the bonding portions 332 for transferring a signal generated by each pixel to the second chip 401 are two-dimensionally arranged. The pad electrodes 511, 512, and 513 are disposed in the second chip 401 are disposed outside the pixel region 521. The bonding portions 334 for supplying a voltage to the pixel region 521 in the first chip 301 are disposed. The voltage is to be applied to the pad electrodes 511 disposed in the second chip 401. In both the first direction 550 and the second direction 560, the length of the bonding portions 334 is larger than the length of the bonding portions 332. The area of each bonding portion 334 is thereby larger than the area of each bonding portion 332. The descriptions about FIGS. 4A and 4B are also applicable to FIG. 7.

As described above, the third exemplary embodiment enables increasing the operation speeds of various processing circuits mounted in the second chip 401 while preventing reduction of reliability of the circuit region 531 in the second chip 401. The third exemplary embodiment also enables facilitating the forming process of the pad openings and wire bondings.

Figure 8:
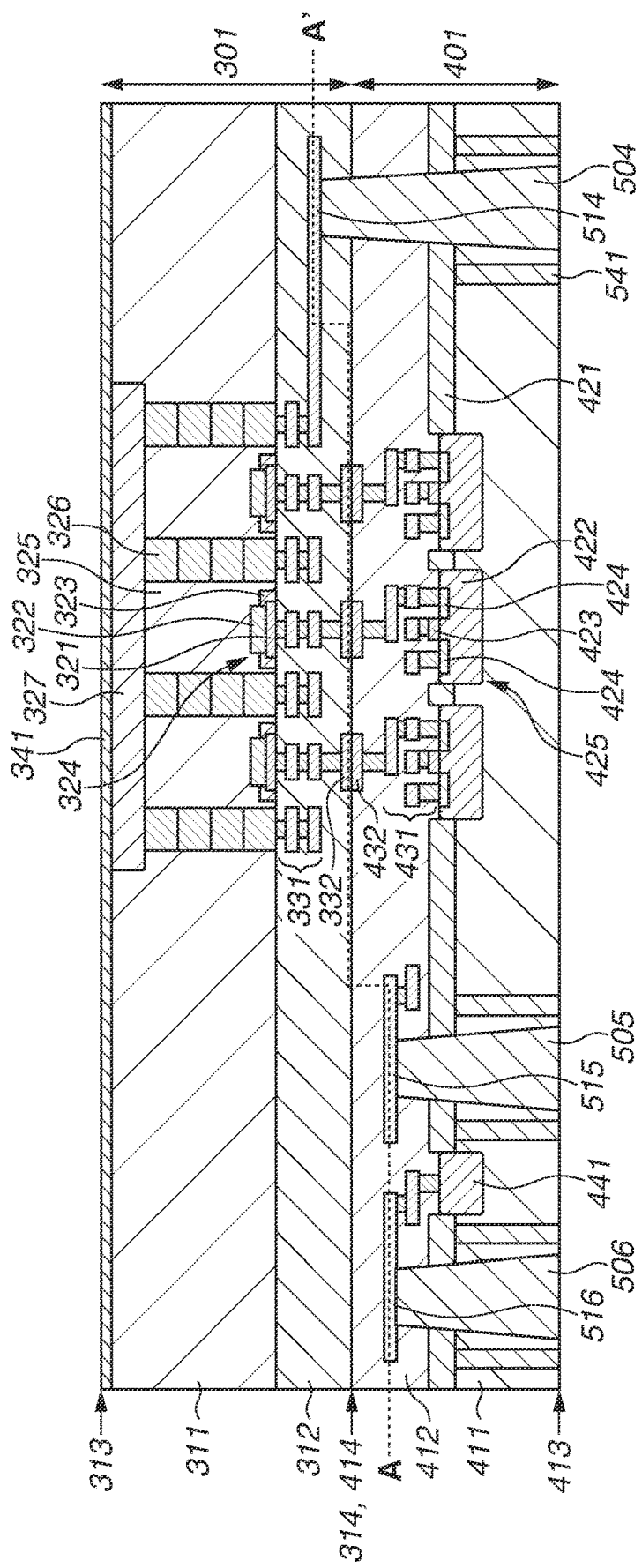
FIG. 8 is a cross-sectional view illustrating a photoelectric conversion apparatus according to a fourth exemplary embodiment.

FIG. 8 is a cross-sectional view illustrating a photoelectric conversion apparatus according to a fourth exemplary embodiment. The fourth exemplary embodiment differs from the first exemplary embodiment in that through-silicon vias (TSVs) are used instead of wire bondings. For members common to the first exemplary embodiment, descriptions thereof will be omitted.

More specifically, the wire bonding wiring disposed at the bottom of the pad opening 501 according to the first exemplary embodiment corresponds to a Through-Silicon Via (TSV) 504 according to the fourth exemplary embodiment. Likewise, the wire bonding wiring at the bottom of the pad opening 502 corresponds to a TSV 505, and the wire bonding wiring at the bottom of the pad opening 503 corresponds to a TSV 506.

The pad electrode 511 (first electrode) according to the first exemplary embodiment corresponds to an electrode 514 (first electrode) according to the fourth exemplary embodiment. Likewise, the pad electrode 513 (second electrode) corresponds to an electrode 516 (second electrode), and the pad electrode 512 (third electrode) corresponds to an electrode 515. More specifically, these electrodes are disposed in the multilayer wiring layer 431 (second multilayer wiring layer) and are common in that a voltage is supplied from the outside of the photoelectric conversion apparatus.

According to the fourth exemplary embodiment, the bottom of the opening (first opening) formed to expose the electrode 514 is disposed between the surface 313 (first surface) and the surface 314 (second surface) of the first chip 301 to connect between the electrode 514 and an external power source. This point is also common to the first exemplary embodiment. Likewise, the bottoms of the openings (second and third openings) for exposing the electrodes 516 and 515 are disposed between the surface 414 (third surface) and the surface 413 (fourth surface) of the second chip 401. This point is also common to the first exemplary embodiment. According to the present specification, even if openings (trenches) are formed and then filled with electrodes, positions where openings are formed may be referred to as "openings".

According to the first to the third exemplary embodiments, in a case where the wire bonding wiring is used for the electrode structure, additional spaces for implementing wires are required for the chip size, and thus it is difficult to reduce the package size. In a case of TSVs in contrast, since TSVs and the package substrate are connected via bumps, the chip size and the package size can be made substantially the same. Thus, the reduction of the package size is more advantageous than the wire bonding wiring.

Like the first exemplary embodiment, the potential applied to the TSV 504 is supplied to the pixel region 521 in the first chip 301 via the electrode 514. The potentials applied to the TSVs 505 and 506 are supplied to the semiconductor layer 411 equivalent to the circuit region 531 in the second chip 401 via the electrodes 515 and 516, respectively. On the other hand, the potential applied to the TSV 504 is not supplied to the circuit region 531 in the second chip 401. Thus, similarly as described in the first exemplary embodiment, the present exemplary embodiment enables preventing the reduction of the reliability of the circuit region 531 disposed in the second chip 401. Since the TSV 505 is disposed in the second chip 401, various processing circuits disposed in the second chip 401 can be operated at a high speed.

The electrode 514 disposed in the first chip 301 is disposed in the wiring layer having the same height as that of the top layer wiring of the multilayer wiring layer 331 in the first chip 301. The electrodes 515 and 516 disposed in the second chip 401 are disposed in the wiring layer having the same height as that of the top layer wiring of the multilayer wiring layer 431 in the second chip 401.

A TSV is formed by forming an opening (trench) penetrating through the semiconductor layer 411 through an etching process and then filling the opening with a metal as an electrode material. When forming trenches corresponding to a plurality of TSVs through the etching process, the smaller difference in the level of the trench depth makes the etching process simpler. Thus, the process of forming TSVs can be facilitated by disposing electrodes in contact with TSVs in the wiring layer having the same height as that of the top layer wiring in each chip.

Figure 9:
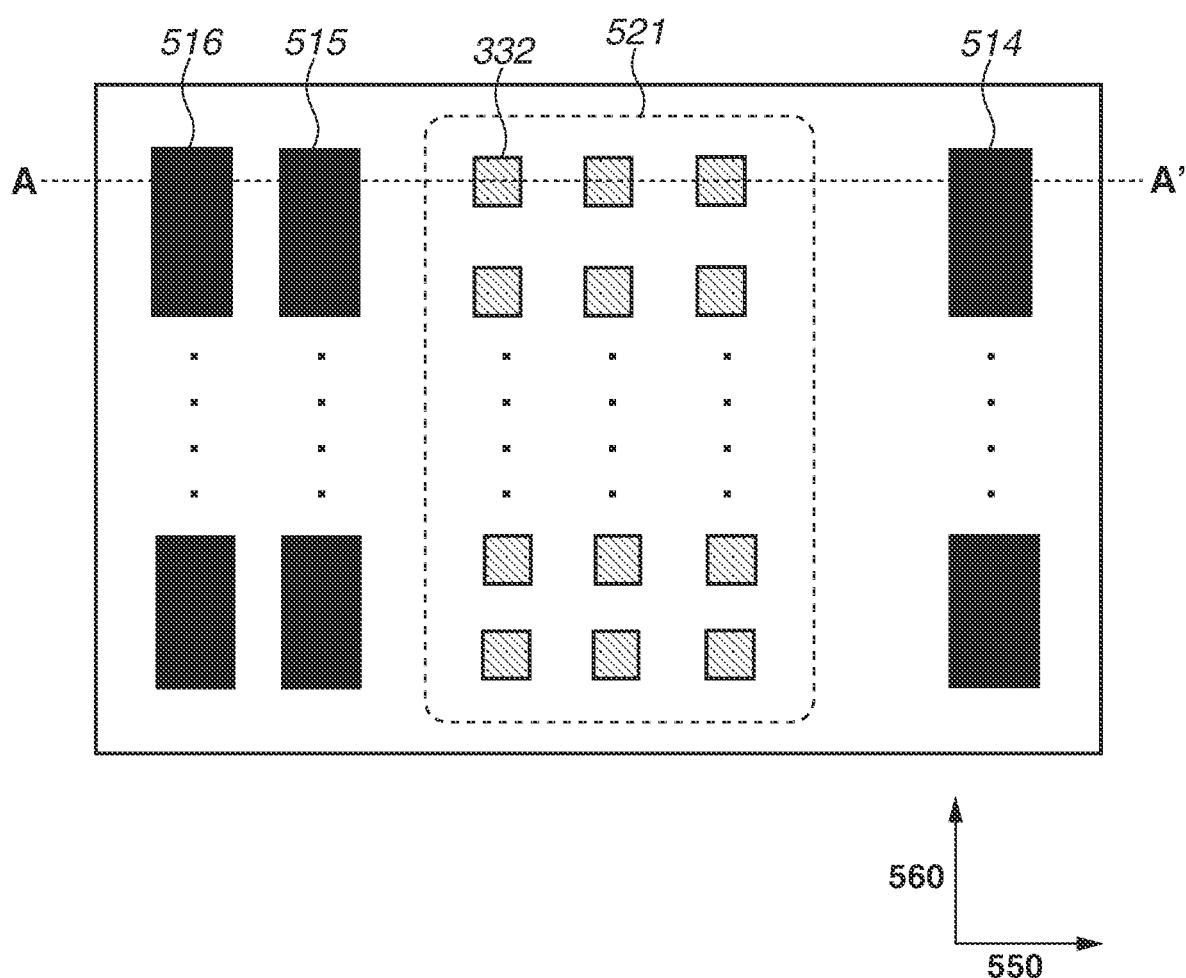
FIG. 9 is a plan view illustrating the photoelectric conversion apparatus according to the fourth exemplary embodiment.

FIG. 9 is a plan view illustrating the photoelectric conversion apparatus planarly viewed along the broken line A-A' illustrated in FIG. 8. In the pixel region 521, the bonding portions 332 for transferring a signal generated by each pixel to the second chip 401 are two-dimensionally arranged. The electrodes 514 in the first chip 301, and the electrodes 515 and 516 in the second chip 401 are disposed outside the pixel region 521. The descriptions about FIGS. 4A and 4B are also applicable to FIG. 9.

As described above, the fourth exemplary embodiment enables reducing the package size, preventing reduction of reliability of the circuit region 531 in the second chip 401, and increasing the operation speeds of various processing circuits mounted in the second chip 401.

Figure 10:
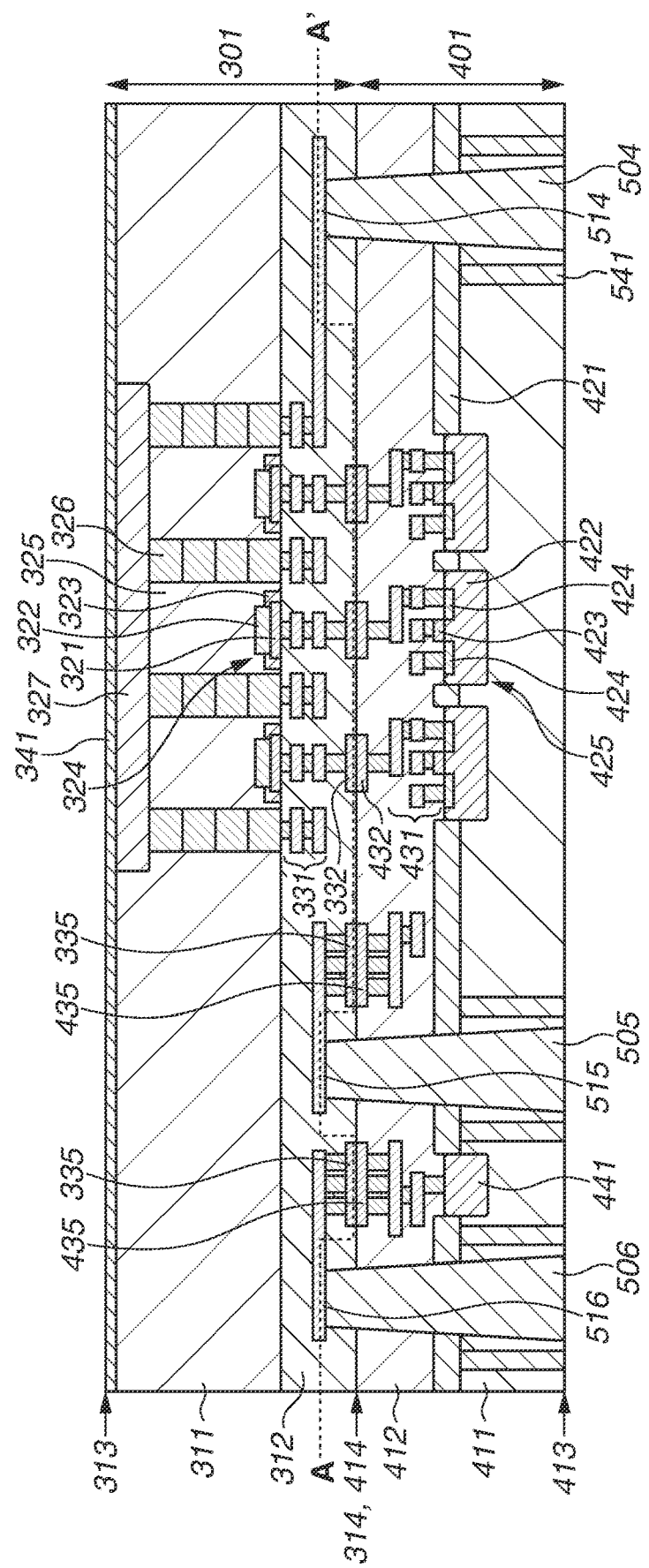
FIG. 10 is a cross-sectional view illustrating a photoelectric conversion apparatus according to a fifth exemplary embodiment.

FIG. 10 is a cross-sectional view illustrating a fifth exemplary embodiment. The fifth exemplary embodiment differs from the fourth exemplary embodiment in that the electrodes 515 and 516 are disposed in the first chip 301. For members common to the first exemplary embodiment, descriptions thereof will be omitted.

According to the fourth exemplary embodiment, the electrode 514 in the first chip 301, and the electrodes 515 and 516 in the second chip 401 are disposed at different locations. Thus, it is suitable to optimize the etching conditions for forming trenches and the film forming conditions for filling trenches with a metal depending on the location of each electrode. According to the fifth exemplary embodiment in contrast, all of the electrodes 514, 515, and 516 are disposed in the first chip 301, and thereby eliminating a need of optimizing process conditions depending on the location where each electrode is provided, and thus facilitating each process.

It is desirable to dispose the electrodes 514, 515, and 516 in the same wiring layer of the multilayer wiring layer 331 in the first chip 301. More specifically, referring to FIG. 10, the electrodes 514, 515, and 516 are disposed in the top layer of the multilayer wiring layer 331. Accordingly, these TSVs have the same trench depth. This makes it possible to equalize the etching conditions for forming trenches and the film forming conditions for filling trenches with a metal as an electrode material. Thus, these trenches can be formed in a same process.

Referring to FIG. 10, the electrodes 515 and 516 are connected with a bonding portion 335 via a plurality of via plugs. More specifically, one electrode and one bonding portion disposed in the multilayer wiring layer 331 are connected by a plurality of via plugs. Likewise, the wiring disposed in the top layer of the multilayer wiring layer 431 disposed in the second chip 401 is connected with the bonding portion 433 via a plurality of via plugs. This enables reducing the electrical resistance and restrain signal propagation delays.

According to the first exemplary embodiment as described above, the electrode 514 in the first chip 301 is applied with the voltage VL (first voltage) out of voltages for performing the avalanche multiplication on the avalanche diode 324. This voltage is drawn in the multilayer wiring layer 331 disposed in the first chip 301, and therefore is not supplied to the circuit region 531 in the second chip 401. More specifically, this voltage can prevent reduction of reliability of the circuit region 531 disposed in the second chip 401.

Figure 11:
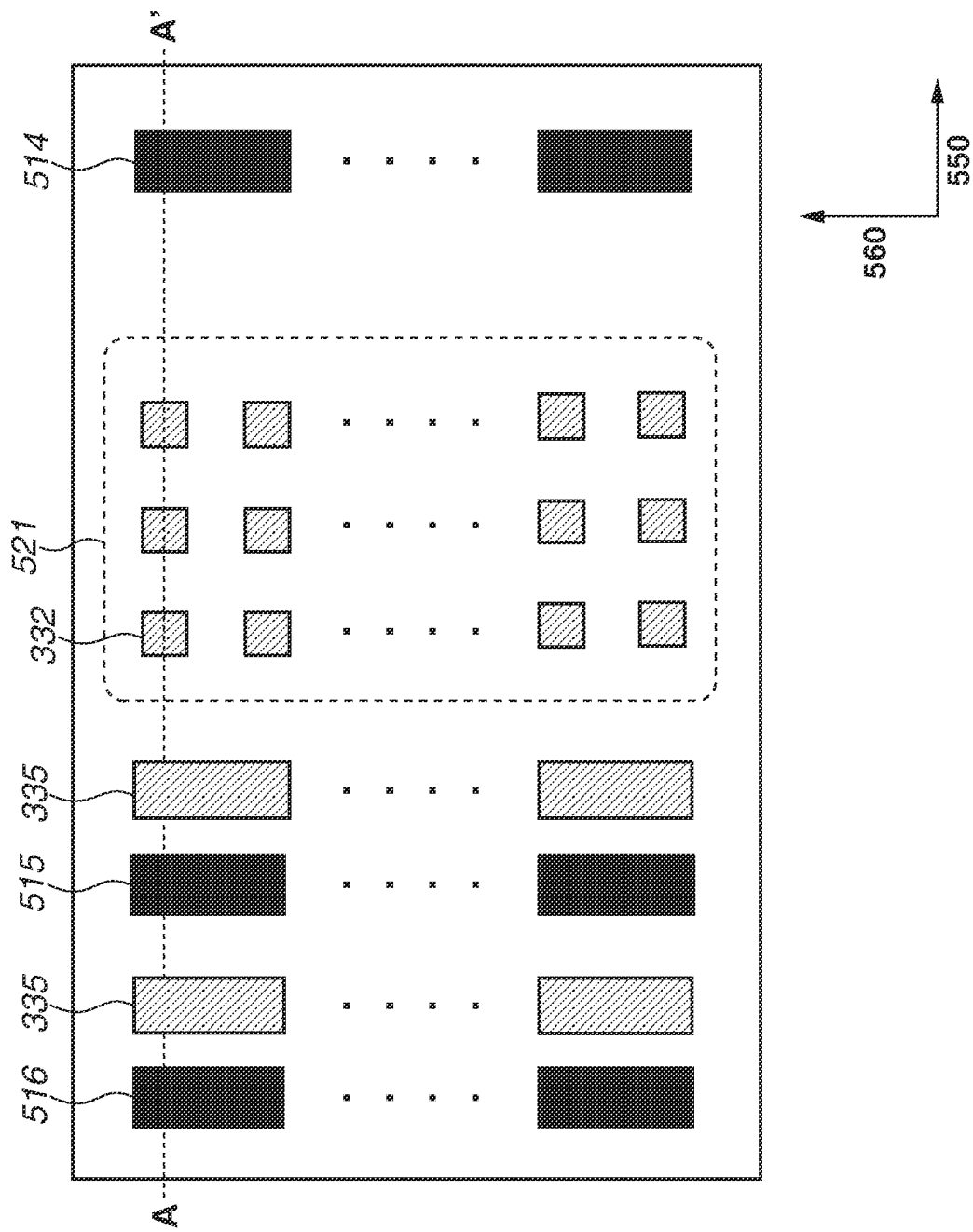
FIG. 11 is a plan view illustrating the photoelectric conversion apparatus according to the fifth exemplary embodiment.

FIG. 11 is a plan view illustrating the photoelectric conversion apparatus including broken line A-A' illustrated in FIG. 10. In the pixel region 521, the bonding portions 332 for transferring a signal generated by each pixel to the second chip 401 are two-dimensionally arranged. The following elements are disposed outside the pixel region 521: the electrodes 514 in the first chip 301, the electrodes 515 and 516 in the first chip 301, and the bonding portions 335 for transferring the voltages applied to these electrodes to the second chip 401. The descriptions for FIGS. 4A and 4B are also applicable to FIG. 11.

From above description, the fifth exemplary embodiment enables preventing the reduction of the reliability of the circuit region 531 in the second chip 401. The fifth exemplary embodiment also enables facilitating the process of forming TSVs.

Figure 12:
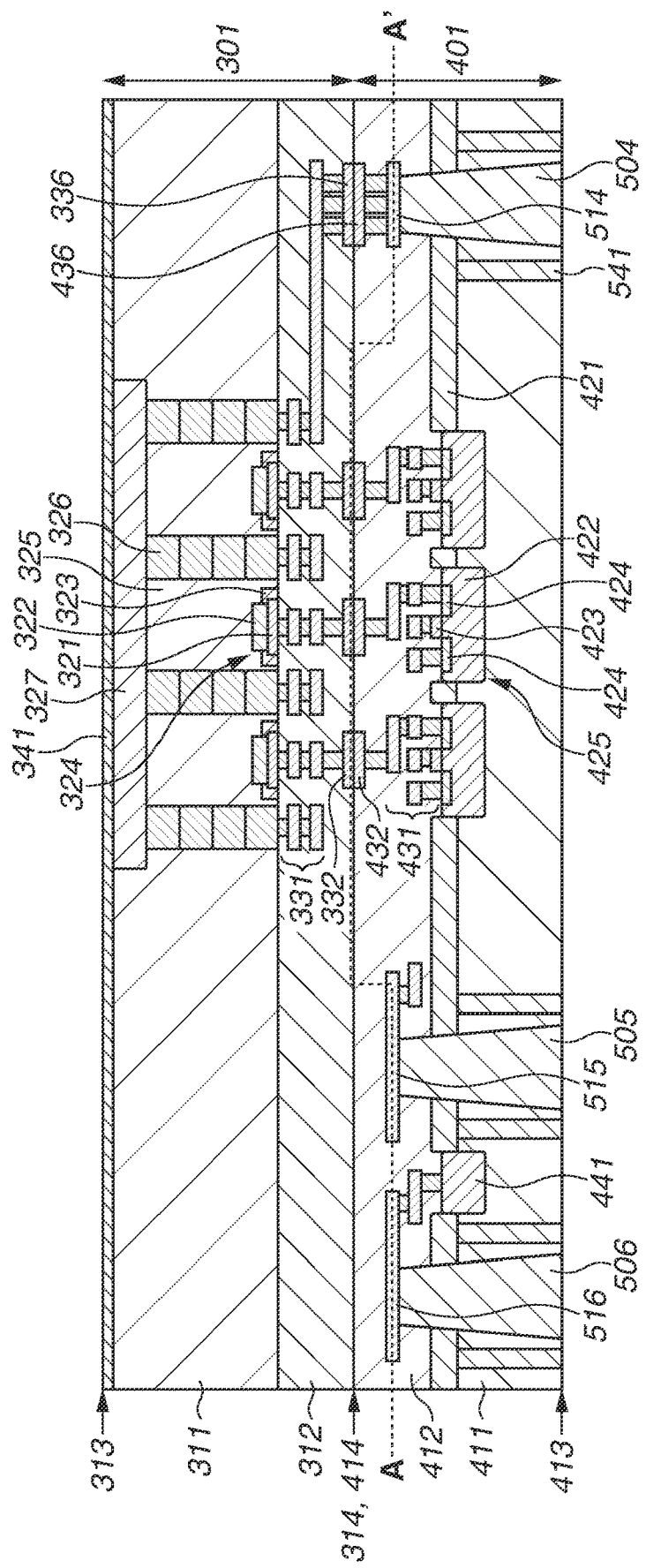
FIG. 12 is a cross-sectional view illustrating a photoelectric conversion apparatus according to a sixth exemplary embodiment.

FIG. 12 is a cross-sectional view illustrating a photoelectric conversion apparatus according to a sixth exemplary embodiment. The sixth exemplary embodiment differs from the fourth exemplary embodiment in that the electrode 514 is disposed in the second chip 401. For members common to the fourth exemplary embodiment, descriptions thereof will be omitted.

According to the sixth exemplary embodiment, the electrodes 514, 515, and 516 are disposed in the second chip 401. Thus, in comparison with the fourth exemplary embodiment, there is no need to optimize the etching conditions for forming trenches and the film forming conditions for filling trenches with a metal according to the depth of each electrode, and thus facilitating each process.

It is desirable that the depth at which the electrodes 514, 515, and 516 are disposed is the same as the depth in the second chip 401. These TSVs thereby have the same trench depth. This makes it possible to equalize the etching conditions for forming trenches and the film forming conditions for filling trenches with a metal as an electrode material.

According to the sixth exemplary embodiment, the potential applied to the TSV 504 is supplied to the first chip 301 via the bonding portions 436 and 336, and thereby is not supplied to the circuit region 531 in the second chip 401. This enables preventing the reduction of the reliability of the circuit region 531 in the second chip 401.

The electrode 515 is disposed in the second chip 401, and the potential thereof is supplied not only to the MOS transistors 425 but also to various processing circuits mounted in the second chip 401. With an increase in a number of functions demanded for the processing circuits and a number of elements mounted in the second chip 401, high-speed processing may become an issue. In this case, various processing circuits can be operated at higher speeds by disposing the electrode 515 in the second chip 401 and supplying a potential than by disposing the electrode 515 in the first chip 301 and supplying a potential via the bonding portion. Since a cross-sectional view including the broken line A-A' illustrated in FIG. 12 is equivalent to the cross-sectional view illustrated in FIG. 9, detailed descriptions thereof will be omitted.

As described above, the sixth exemplary embodiment enables preventing the reduction of the reliability of the circuit region 531 in the second chip 401, increasing the operation speeds of various processing circuits mounted in the second chip 401, and facilitating the process of forming TSVs.

Figure 13:
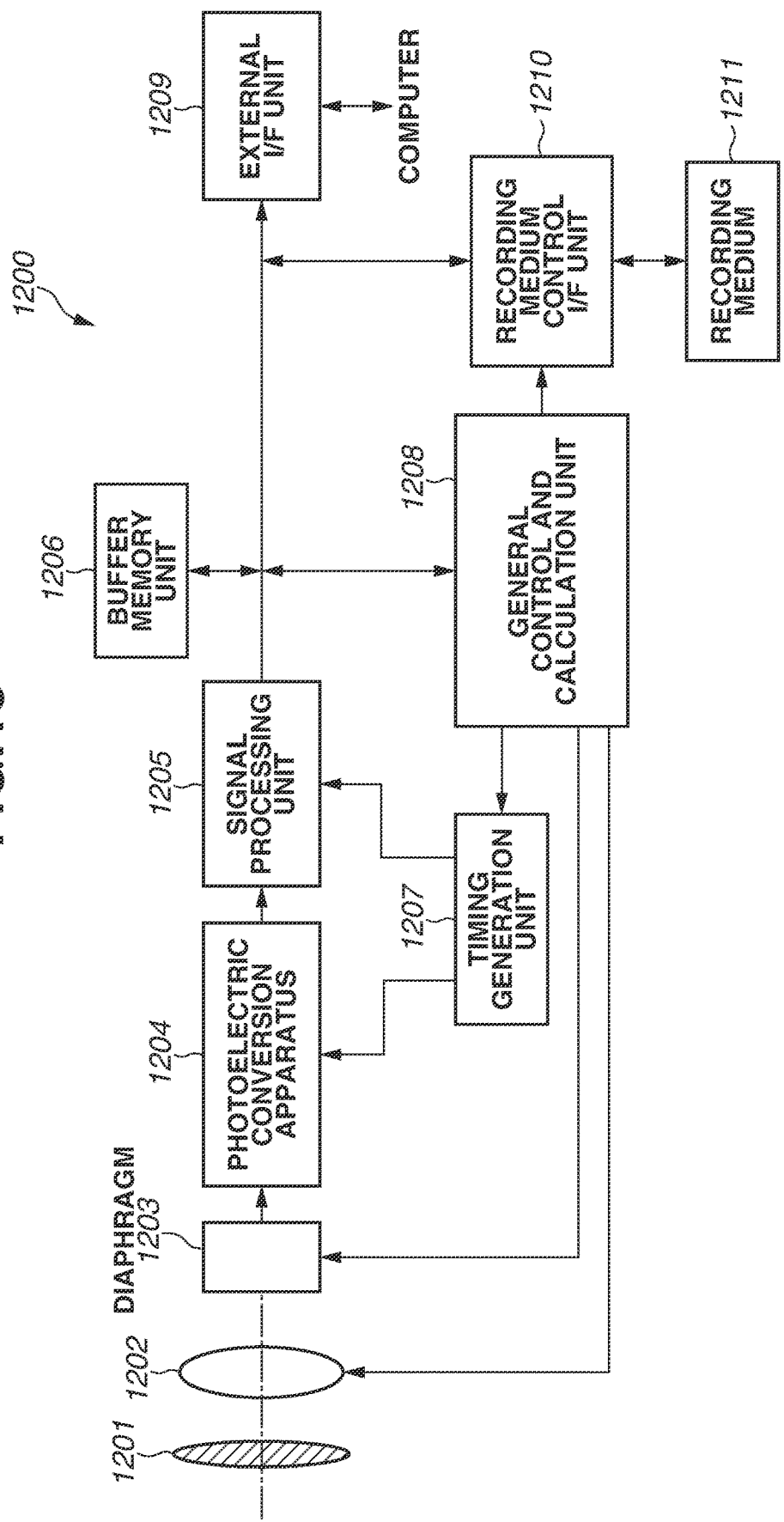
FIG. 13 is a block diagram schematically illustrating a configuration of a seventh exemplary embodiment.

FIG. 13 illustrates a configuration of a photoelectric conversion system 1200 according to the present exemplary embodiment. The photoelectric conversion system 1200 according to the present exemplary embodiment includes a photoelectric conversion apparatus 1204. Any one of the photoelectric conversion apparatuses according to the above-described exemplary embodiments is applicable to the photoelectric conversion apparatus 1204. For example, the photoelectric conversion system 1200 can be used as an imaging system. Specific examples of imaging systems include digital still cameras, digital camcorders, and monitoring cameras. Referring to the example illustrated in FIG. 13, a digital still camera is used as the photoelectric conversion system 1200.

The photoelectric conversion system 1200 illustrated in FIG. 13 includes the photoelectric conversion apparatus 1204, a lens 1202 for focusing an optical image of a subject on the photoelectric conversion apparatus 1204, a diaphragm 1203 for varying an amount of light passing through the lens 1202, and a barrier 1201 for protecting the lens 1202. The lens 1202 and the diaphragm 1203 form an optical system for condensing light to the photoelectric conversion apparatus 1204.

The photoelectric conversion system 1200 includes a signal processing unit 1205 for processing an output signal output from the photoelectric conversion apparatus 1204. The signal processing unit 1205 subjects the input signal as required to various signal processing such as corrections and compression, and outputs the resultant signal. The photoelectric conversion system 1200 further includes a buffer memory unit 1206 for temporarily storing image data, and an external interface unit (external I/F unit) 1209 for communicating with an external computer. The photoelectric conversion system 1200 further includes a recording medium 1211 such as a semiconductor memory for recording and reading imaging data, and a recording medium control interface unit (recording medium control I/F unit) 1210 for recording and reading data to/from the recording medium 1211. The recording medium 1211 may be built in the photoelectric conversion system 1200 or attachable to and detachable from the photoelectric conversion system 1200. Communication between the recording medium control I/F unit 1210 and the recording medium 1211 and communication between the external I/F unit 1209 and the external computer may be wirelessly performed.

The photoelectric conversion system 1200 further includes a general control and calculation unit 1208 for performing various calculations and controlling the entire digital still camera, and a timing generation unit 1207 for outputting various timing signals to the photoelectric conversion apparatus 1204 and the signal processing unit 1205. The timing signals may be input from the outside. The photoelectric conversion system 1200 includes at least the photoelectric conversion apparatus 1204, and the signal processing unit 1205 for processing output signals output from the photoelectric conversion apparatus 1204.

The general control and calculation unit 1208 and the timing generation unit 1207 may be configured to perform a part or whole of control function of the photoelectric conversion apparatus 1204.

The photoelectric conversion apparatus 1204 outputs a signal for imaging to the signal processing unit 1205. The signal processing unit 1205 subjects the signal for imaging output from the photoelectric conversion apparatus 1204 to predetermined signal processing, and outputs image data. The signal processing unit 1205 generates an image by using the signal for imaging. The signal processing unit 1205 may subject the signal output from the photoelectric conversion apparatus 1204 to distance measurement calculation. The signal processing unit 1205 and the timing generation unit 1207 may be mounted on the photoelectric conversion apparatus 1204. More specifically, the signal processing unit 1205 and the timing generation unit 1207 may be disposed in a chip with pixels arranged therein. Configuring an imaging system by using the photoelectric conversion apparatus 1204 according to each of the above-described exemplary embodiments enables implementing a photoelectric conversion system capable of acquiring images with high quality.

Figure 14A:
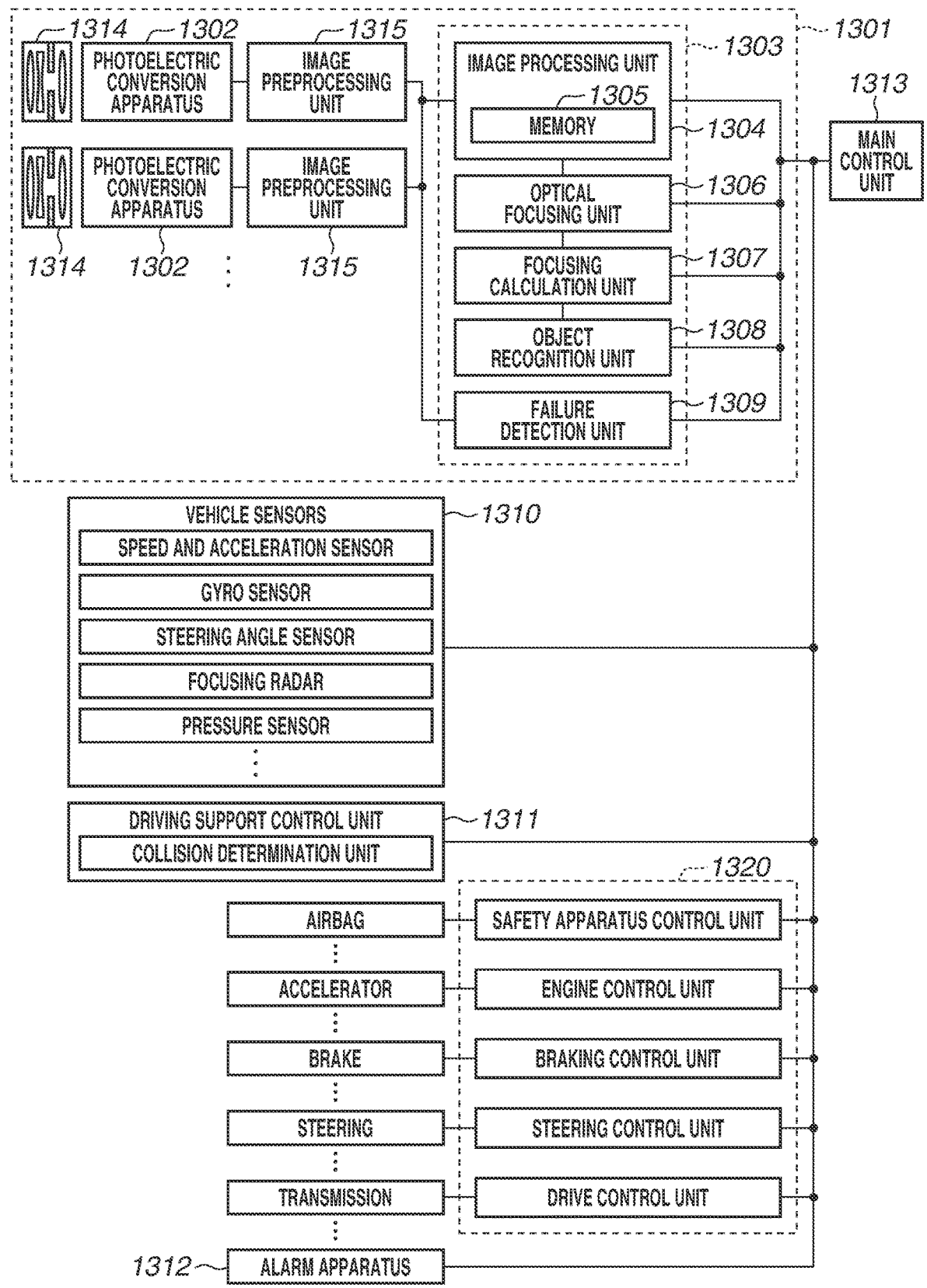
FIG. 14A is a block diagram illustrating a photoelectric conversion system according to an eighth exemplary embodiment.
Figure 15:
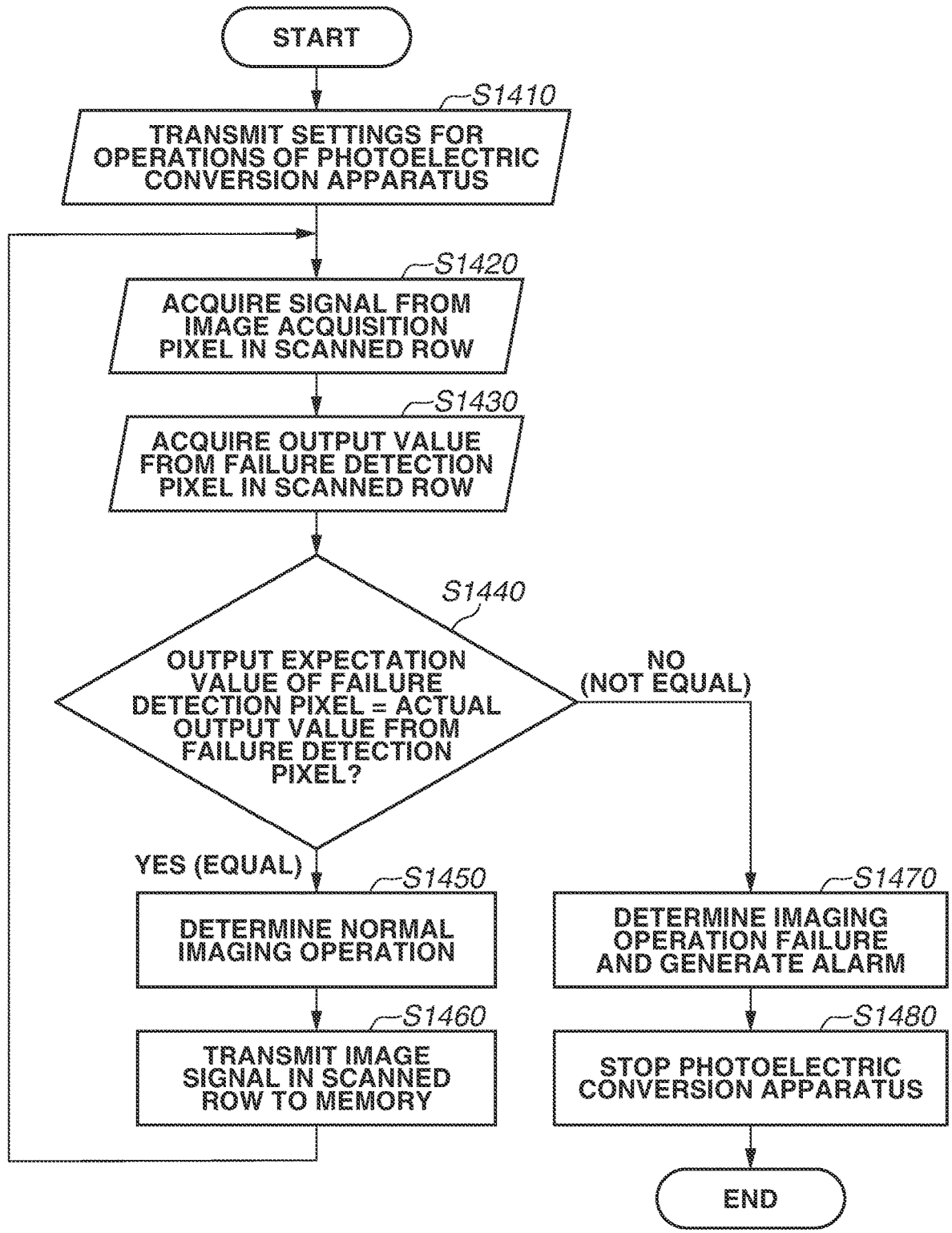
FIG. 15 is a flowchart illustrating operations of the photoelectric conversion system according to the eighth exemplary embodiment.

A photoelectric conversion system and a moving object according to the present exemplary embodiment will be described with reference to FIGS. 14A, 14B, and 15. FIG. 14 is a schematic view illustrating an example of a configuration of the photoelectric conversion system and the moving object according to the present exemplary embodiment. FIG. 15 is a flowchart illustrating operations of the photoelectric conversion system according to the present exemplary embodiment. According to the present exemplary embodiment, an on-vehicle camera is used as an example of a photoelectric conversion system.

FIG. 14 illustrates an example of a vehicle system and an example of a photoelectric conversion system for performing imaging mounted on the vehicle system. A photoelectric conversion system 1301 includes a photoelectric conversion apparatus 1302, an image preprocessing unit 1315, an integrated circuit 1303, and an optical system 1314. The optical system 1314 forms an optical image of a subject on the photoelectric conversion apparatus 1302. The photoelectric conversion apparatus 1302 converts the optical image formed by the optical system 1314 into an electrical signal. The photoelectric conversion apparatus 1302 is the photoelectric conversion apparatus according to one of the above-described exemplary embodiments. The image preprocessing unit 1315 subjects the signal output from the photoelectric conversion apparatus 1302 to predetermined signal processing. The function of image preprocessing unit 1315 may be built in the photoelectric conversion apparatus 1302. The photoelectric conversion system 1301 includes at least two sets of the optical system 1314, the photoelectric conversion apparatus 1302, and the image preprocessing unit 1315. The output from the image preprocessing unit 1315 of each set is input to the integrated circuit 1303.

The integrated circuit 1303, which is an integrated circuit for imaging system applications, includes an image processing unit 1304 including a memory 1305, an optical distance measurement unit 1306, a distance calculation unit 1307, an object recognition unit 1308, and a failure detection unit 1309. The image processing unit 1304 subjects the output signal of the image preprocessing unit 1315 to image processing such as development processing and fault correction. The memory 1305 primarily stores a captured image, and stores defect positions of imaging pixels. The optical distance measurement unit 1306 focuses the subject and performs distance measurement. The distance calculation unit 1307 calculates distance measurement information based on a plurality of image data pieces acquired by a plurality of the photoelectric conversion apparatuses 1302. The object recognition unit 1308 recognizes subjects, such as vehicles, paths, traffic signs, and persons. The failure detection unit 1309, upon detection of a failure of the photoelectric conversion apparatus 1302, issues an alarm to a main control unit 1313.

The integrated circuit 1303 may be implemented by specially designed hardware, software modules, or a combination of both. The integrated circuit 1303 may also be implemented by a field programmable gate array (FPGA), an application specific integrated circuit (ASIC), or a combination of both.

The main control unit 1313 totally controls operations of the photoelectric conversion system 1301, vehicle sensors 1310, and a control unit 1320. A certain method may also be applicable without using the main control unit 1313. In this method, each of the photoelectric conversion system 1301, the vehicle sensors 1310, and the control unit 1320 has a communication interface and transmits/receives control signals via a communication network (e.g., based on the CAN standard).

The integrated circuit 1303 has a function of receiving control signals from the main control unit 1313 and a function of transferring control signals and setting values to the photoelectric conversion apparatus 1302 via its own control unit.

The photoelectric conversion system 1301 connected to the vehicle sensors 1310 is capable of detecting vehicle running states (including a vehicle speed, yaw rate, and steering angle), an environment outside the vehicle, and states of other vehicles and obstacles. The vehicle sensors 1310 also serve as distance information acquisition units for acquiring information about the distance to the subject. The photoelectric conversion system 1301 is connected to a driving support control unit 1311 that performs various driving support functions such as automatic steering, automatic cruising, and collision prevention functions. In particular, a collision determination function presumes and determines a collision with other vehicles and obstacles based on detection results generated by the photoelectric conversion system 1301 and the vehicle sensors 1310. This function performs collision avoidance control when a collision is presumed, and activates a safety apparatus when a collision takes place.

The photoelectric conversion system 1301 is also connected to an alarm apparatus 1312 for issuing an alarm to the driver based on a determination result generated by a collision determination unit. For example, when the possibility of collision becomes high based on the determination result generated by the collision determination unit, the main control unit 1313 performs vehicle control to avoid a collision or reduce damages by, for example, applying brakes, releasing an accelerator, or restraining engine power. The alarm apparatus 1312 warns the driver by generating an alarm sound, displaying alarm information on the display screen of a car navigation system or meter panel, or applying a vibration to the seat belt or steering wheel.

According to the present exemplary embodiment, the photoelectric conversion system 1301 captures images of the surrounding of the vehicle, for example, images ahead or behind the vehicle. FIG. 14B illustrates an example of a layout of the photoelectric conversion system 1301 in a case where images ahead of the vehicle are captured by the photoelectric conversion system 1301.

Two pieces of photoelectric conversion apparatus 1302 are disposed at forward positions of a vehicle 1300. More specifically, assuming that the central line along a forward/backward traveling direction or in a direction of an outer shape (e.g., width) of the vehicle 1300 is a symmetric axis, it is desirable to dispose the two pieces of photoelectric conversion apparatus 1302 in line symmetry with respect to the symmetric axis in order to acquire information about the distance between the vehicle 1300 and the subject and determine the possibility of a collision. It is also desirable that positions of the photoelectric conversion apparatuses 1302 are positions where the driver's sight is not disturbed by the photoelectric conversion apparatuses 1302 when the driver views the situation outside the vehicle 1300 from the driver's seat. The alarm apparatus 1312 is desirably disposed at a position that easily comes into the driver's sight.

A failure detection operation of the photoelectric conversion apparatuses 1302 in the photoelectric conversion system 1301 will be described with reference to FIG. 15. The photoelectric conversion apparatus 1302 performs the failure detection operation according to steps S1410 to S1480 in a flowchart illustrated in FIG. 15.

In step S1410, each photoelectric conversion apparatus 1302 performs start-up setting processing. In the processing, settings for operations of the photoelectric conversion system 1301 are transferred from the outside of the photoelectric conversion system 1301 (e.g., the main control unit 1313) or the inside thereof, and start the imaging operation and the failure detection operation of the photoelectric conversion apparatus 1302.

In step S1420, the main control unit 1313 acquires a pixel signal from an effective pixel. In step S1430, the main control unit 1313 acquires an output value from a failure detection pixel arranged for failure detection. The failure detection pixel includes a photoelectric conversion portion like the effective pixel. A predetermined voltage is written to the photoelectric conversion portion. The failure detection pixel outputs a signal corresponding to the voltage written to the photoelectric conversion portion. Steps S1420 and S1430 may be reversed.

In step S1440, the main control unit 1313 determines whether the output expectation value of the failure detection pixel coincides with the actual output value of the failure detection pixel. If the output expectation value coincides with the actual output value as a result of the determination (YES in step S1440), the processing proceeds to step S1450. In step S1450, the main control unit 1313 determines that the imaging operation is normally performed, and the processing proceeds to step S1460. In step S1460, the main control unit 1313 transmits the pixel signal of a scanned row to the memory 1305 to primarily store the pixel signal. The processing then returns to step S1420, and the main control unit 1313 continues the failure detection operation. On the other hand, if the output expectation value does not coincide with the actual output value (NO in step S1440), the processing proceeds to step S1470. In step S1470, the main control unit 1313 determines that the imaging operation fails and then issues an alarm to the main control unit 1313 or to the alarm apparatus 1312. The alarm apparatus 1312 displays that a failure has been detected on the display unit. In step S1480, the main control unit 1313 stops the photoelectric conversion apparatus 1302 and ends the operation of the photoelectric conversion system 1301.

In the flowchart according to the present exemplary embodiment, a loop is executed for each row. However, a loop may be executed for a plurality of rows or the failure detection operation may be performed for each frame. The alarm issued in step S1470 may be notified to the outside of the vehicle via a wireless network.

Although the present exemplary embodiment has been described above centering on control for avoiding a collision with other vehicles, the present exemplary embodiment is also applicable to automatic driving control for following another vehicle or automatic driving control for retaining the vehicle within the lane. The photoelectric conversion system 1301 is applicable not only to vehicles but also to moving objects (moving apparatuses) such as vessels, airplanes, and industrial robots. In addition, the photoelectric conversion system 1301 is applicable not only to moving objects but also to intelligent transport systems (ITS's) and a wide range of apparatuses utilizing object recognition.

The present disclosure is not limited to the above-described exemplary embodiments and can be modified in diverse ways. For example, the present disclosure also includes an exemplary embodiment in which a part of the configuration of another exemplary embodiment is appended, or an exemplary embodiment in which a part of the configuration is replaced with a part of the configuration of another exemplary embodiment.

The above-described exemplary embodiments are to be considered as illustrative in embodying the present disclosure, and not restrictive of the technical scope of the present disclosure. The present disclosure may be embodied in diverse forms without departing from the technical concepts or essential characteristics thereof.

The prevent disclosure enables offering a photoelectric conversion apparatus having an avalanche diode that ensures reliability.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A photoelectric conversion apparatus comprising:
a first chip including a first semiconductor layer having an avalanche diode; and
a second chip including a second semiconductor layer having a signal processing portion for processing a signal based on an output from the avalanche diode,
wherein the first chip and the second chip overlap each other,
wherein the avalanche diode is applied with a first voltage and a second voltage and a potential difference between the first voltage and the second voltage exceeds a breakdown voltage that causes avalanche multiplication,
wherein a first electrode to which the first voltage is supplied from an outside of the first chip and the second chip is provided between a surface of the first semiconductor layer and a surface of the second chip,
wherein the first electrode is not electrically connected with the second semiconductor layer, and
wherein the second chip is provided with a quench element electrically connected to the avalanche diode.

2. The photoelectric conversion apparatus according to claim 1,
wherein the first chip includes a first multilayer wiring layer,
wherein the second chip includes a second multilayer wiring layer; and
wherein the first chip and the second chip overlap each other on top of a surface of the first multilayer wiring layer and a surface of the second multilayer wiring layer.

3. The photoelectric conversion apparatus according to claim 2,
wherein the surface of the first semiconductor layer is not a surface opposite to the first multilayer wiring layer.

4. The photoelectric conversion apparatus according to claim 2,
wherein the first multilayer wiring layer has a first bonding portion,
wherein the second multilayer wiring layer has a second bonding portion in contact with the first bonding portion, and
wherein the first voltage supplied to the first electrode is not applied to a bonding surface where the first bonding portion and the second bonding portion come into contact.

5. The photoelectric conversion apparatus according to claim 4,
wherein the avalanche diode is electrically connected with the quench element via the first and the second bonding portions.

6. The photoelectric conversion apparatus according to claim 4,
wherein, in a planar view, a length of the first electrode in a predetermined direction is larger than a length of the first bonding portion in the predetermined direction.

7. The photoelectric conversion apparatus according to claim 2,
wherein the first or the second multilayer wiring layer is provided with the first electrode supplied with the first voltage from the outside of the first chip and the second chip; and
wherein the first or the second multilayer wiring layer is provided with a second electrode supplied with the second voltage from the outside of the first chip and the second chip.

8. The photoelectric conversion apparatus according to claim 7,
wherein the first electrode is disposed in the first multilayer wiring layer, and
wherein the second electrode is disposed in the second multilayer wiring layer.

9. The photoelectric conversion apparatus according to claim 2,
wherein the first or the second multilayer wiring layer is provided with a third electrode supplied with a third voltage from the outside of the first chip and the second chip; and
wherein a potential difference between the first voltage and the third voltage is larger than a potential difference between the second voltage and the third voltage.

10. The photoelectric conversion apparatus according to claim 9,
wherein the first voltage is a negative potential, the second voltage is a positive potential and the third voltage is a ground potential.

11. The photoelectric conversion apparatus according to claim 9,
wherein the potential difference between the first voltage and the third voltage exceeds the breakdown voltage.

12. A photoelectric conversion system comprising:
the photoelectric conversion apparatus according to claim 1; and
a signal processing apparatus configured to process a signal output by the photoelectric conversion apparatus.

13. A moving object comprising:
the photoelectric conversion apparatus according to claim 1; and
a distance information acquisition unit configured to acquire information about a distance to an object based on distance measurement information based on a signal from the photoelectric conversion apparatus,
wherein the moving object further comprises a control unit configured to control the moving object based on the information about the distance to the object.

* * * * *